(12) United States Patent
Castro et al.

(10) Patent No.: US 11,268,976 B2
(45) Date of Patent: Mar. 8, 2022

(54) ELECTRODE LAYER PARTITIONING

(71) Applicant: InvenSense, Inc., San Jose, CA (US)

(72) Inventors: Alexander Castro, San Francisco, CA (US); Matthew Thompson, Beaverton, OR (US); Leonardo Baldasarre, Gavirate (IT); Sarah Nitzan, Palo Alto, CA (US); Houri Johari-Galle, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 495 days.

(21) Appl. No.: 15/586,497

(22) Filed: May 4, 2017

(65) Prior Publication Data
US 2018/0238927 A1  Aug. 23, 2018

Related U.S. Application Data

(60) Provisional application No. 62/462,519, filed on Feb. 23, 2017.

(51) Int. Cl.
*G01P 15/125* (2006.01)
*G01P 15/08* (2006.01)
*B81B 3/00* (2006.01)

(52) U.S. Cl.
CPC .......... *G01P 15/125* (2013.01); *B81B 3/0078* (2013.01); *G01P 15/0802* (2013.01); *B81B 2201/0235* (2013.01); *B81B 2201/0242* (2013.01)

(58) Field of Classification Search
CPC ..................................................... G01P 15/125
See application file for complete search history.

(56) References Cited

U.S. PATENT DOCUMENTS

| | | | |
|---|---|---|---|
| 5,350,189 A | 9/1994 | Tsuchitani | |
| 6,825,967 B1 | 11/2004 | Chong et al. | |
| 7,225,675 B2 * | 6/2007 | Kato ................. | G01C 19/5719 73/514.32 |
| 9,400,224 B2 | 7/2016 | Chen et al. | |
| 2011/0041605 A1 | 2/2011 | Kano | |
| 2014/0175572 A1 | 6/2014 | Hsu et al. | |
| 2014/0284188 A1 | 9/2014 | Yamazaki et al. | |
| 2015/0192603 A1 | 7/2015 | Baldasarre | |

\* cited by examiner

*Primary Examiner* — Jill E Culler
*Assistant Examiner* — Ruben C Parco, Jr.
(74) *Attorney, Agent, or Firm* — Haley Guiliano LLP; Joshua Van Hoven

(57) ABSTRACT

A MEMS sensor includes a proof mass that is suspended over a substrate. A sense electrode is located on a top surface of the substrate parallel to the proof mass, and forms a capacitor with the proof mass. The sense electrodes have a plurality of slots that provide improved performance for the MEMS sensor. A measured value sensed by the MEMS sensor is determined based on the movement of the proof mass relative to the slotted sense electrode.

17 Claims, 15 Drawing Sheets

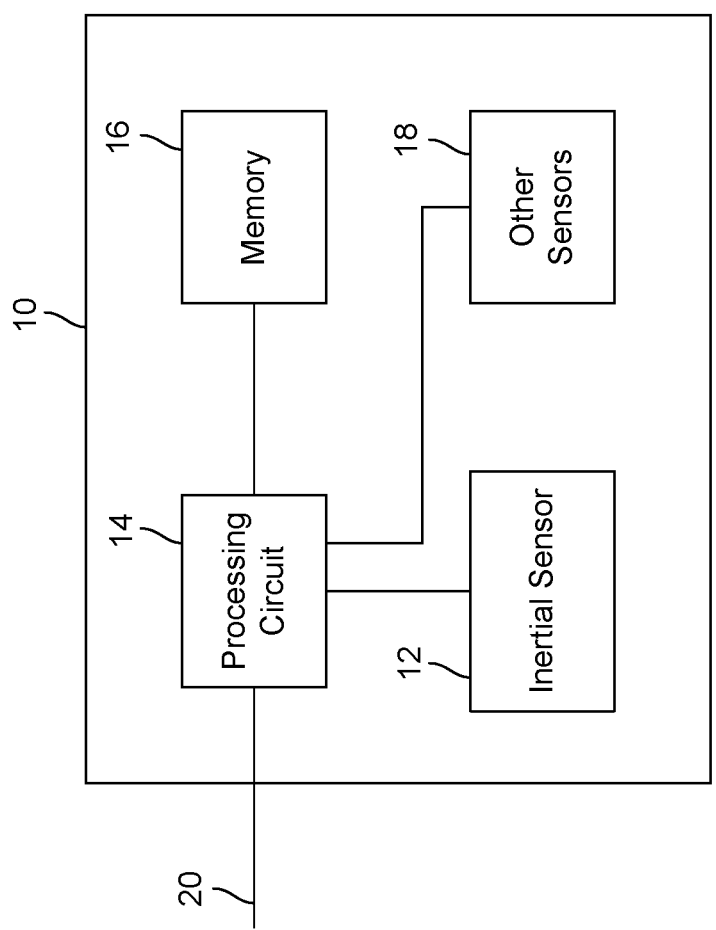

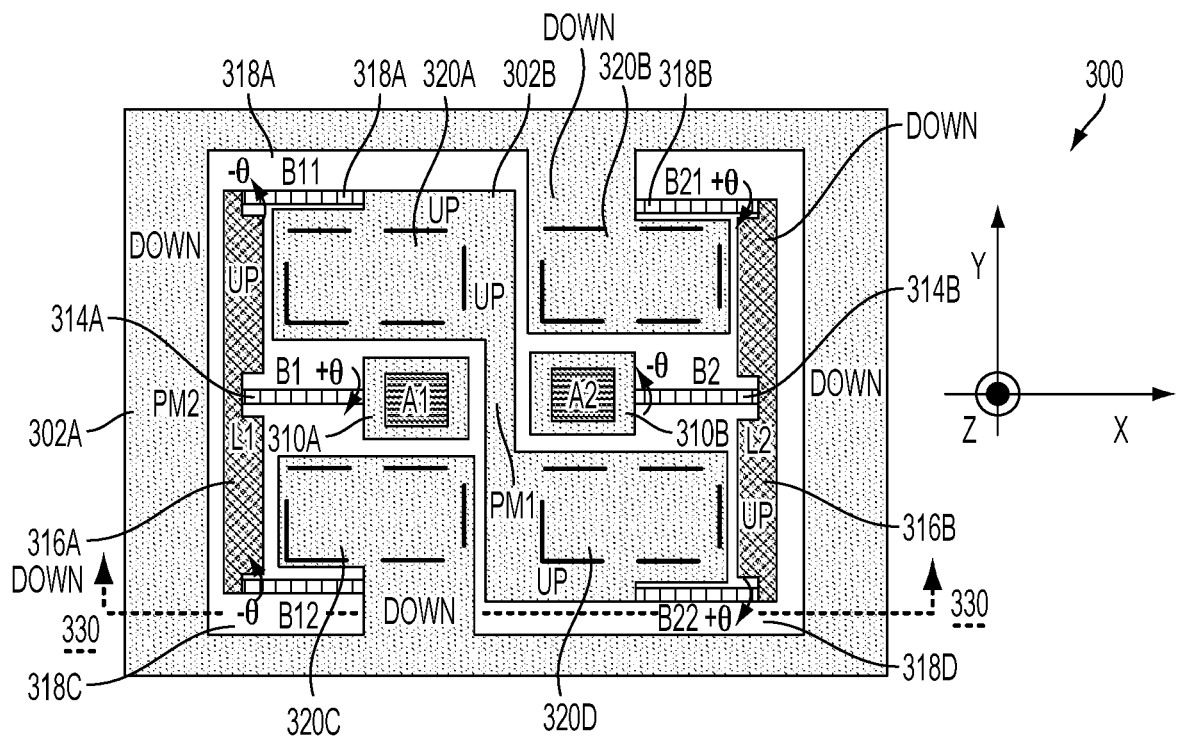
FIG. 3A
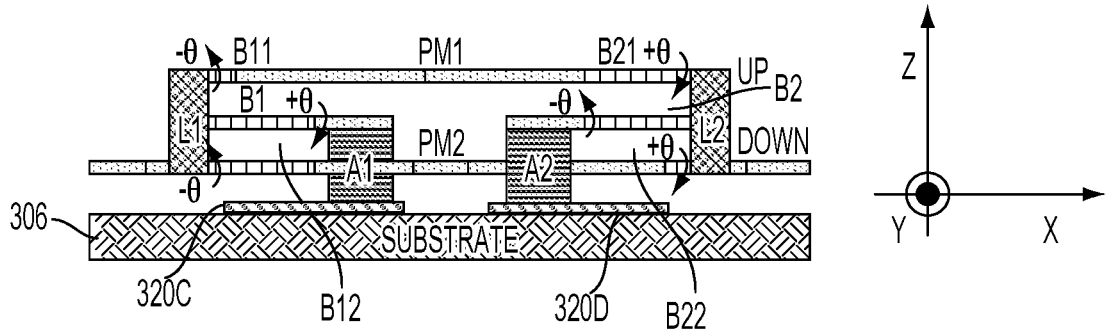
FIG. 3B
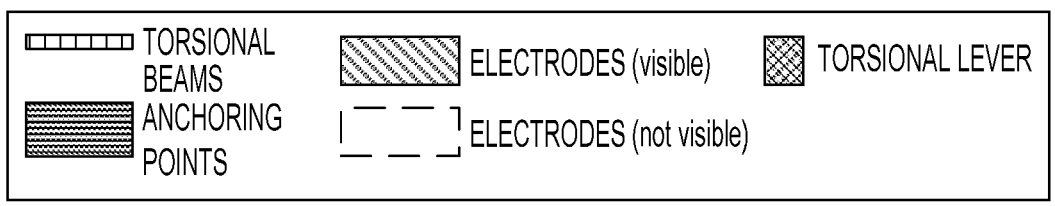

ELECTRODE LAYER PARTITIONING

CROSS REFERENCE TO OTHER APPLICATIONS

This application claims priority to U.S. Provisional Patent Application No. 62/462,519 entitled "Electrode Layer Partitioning," filed Feb. 23, 2017, which is incorporated herein by reference for all purposes.

BACKGROUND

Numerous items such as smart phones, smart watches, tablets, automobiles, aerial drones, appliances, aircraft, exercise aids, and game controllers may utilize motion sensors during their operation. In many applications, various types of motion sensors such as accelerometers and gyroscopes may be analyzed independently or together in order to determine varied information for particular applications. For example, gyroscopes and accelerometers may be used in gaming applications (e.g., smart phones or game controllers) to capture complex movements by a user, drones and other aircraft may determine orientation based on gyroscope measurements (e.g., roll, pitch, and yaw), and vehicles may utilize measurements for determining direction (e.g., for dead reckoning) and safety (e.g., to recognizing skid or roll-over conditions).

Motion sensors such as accelerometers and gyroscopes may be manufactured as microelectromechanical (MEMS) sensors that are fabricated using semiconductor manufacturing techniques. A MEMS sensor may include movable proof masses that can respond to forces such as linear acceleration (e.g., for MEMS accelerometers), angular velocity (e.g., for MEMS gyroscopes), and magnetic field. The operation of these forces on the movable proof masses may be measured based on the movement of the proof masses in response to the forces. In some implementations, this movement is measured based on distance between the movable proof masses and sense electrodes, which form capacitors for sensing the movement.

The operational components of the MEMS sensor such as the movable MEMS layer and sense electrodes are typically encapsulated within a sealed cavity having a suitable pressure based on the sensor type, desired Q-factor, and other related design and operational factors. Because the cavity is sealed, these components may be protected from certain environmental factors such as pressure changes, humidity, and moisture. However, other environmental factors such as temperature, assembly, impact will be experienced by the operational components of the MEMS sensor. The sensors may be located in extreme (e.g., industrial, manufacturing, resource extraction, etc.) environments, or may otherwise be subjected to significant changes in environmental conditions. Repeated exposure to extreme conditions or to changed environmental conditions, or sudden changes in environmental conditions, may cause changes to the physical components within the cavity such as the proof masses or sense electrodes.

SUMMARY OF THE INVENTION

In an embodiment, an exemplary system for providing for capacitive sensing of an external force on a microelectromechanical system (MEMS) device comprises a substrate located in a first plane and a movable component of a MEMS device layer, the MEMS device layer coupled to the substrate, wherein the movable component moves along a first axis in response to the external force. The system further comprises a sense electrode disposed on the substrate in the first plane, wherein a first capacitive sensing element is formed between the movable component and the first sense electrode, wherein the first capacitive sensing element is configured to be responsive to the motion of the movable component along the first axis, and wherein the sense electrode comprises a plurality of slots that substantially extend between two non-adjacent sides of the sense electrode.

A system for performing capacitive sensing comprises a substrate located in a first plane, an electrode shield located on a the first plane, wherein the electrode shield is formed of a first conductive material, and a plurality of sense electrodes disposed on the substrate in the first plane, wherein each of the plurality of sense electrodes is located adjacent to at least a portion of the electrode shield in the first plane, wherein each of the sense electrodes comprises a folded strip electrode, and wherein the length of the folded strip electrode is longer than the length of the perimeter of the sense electrode.

A system for performing capacitive sensing comprises a substrate located in a first plane, an electrode shield located on the first plane, wherein the electrode shield is formed of a first conductive material, and a plurality of sense electrodes disposed on the substrate in the first plane, wherein each of the plurality of sense electrodes is located adjacent to at least a portion of the electrode shield in the first plane, wherein each of the sense electrodes comprises a plurality of slots that substantially extend between two non-adjacent sides of the sense electrode, and wherein the plurality of slots reduce an exposed area of a top surface of each of the sense electrodes by at least 8%.

BRIEF DESCRIPTION OF THE DRAWINGS

The above and other features of the present disclosure, its nature and various advantages will be more apparent upon consideration of the following detailed description, taken in conjunction with the accompanying drawings in which:

FIG. 1 shows an illustrative motion sensing system in accordance with an embodiment of the present disclosure;

FIG. 3A shows a top view of an illustrative MEMS system for sensing linear acceleration in accordance with some embodiments of the present disclosure;

FIG. 3B shows a side section view of an illustrative MEMS system for sensing linear acceleration in accordance with some embodiments of the present disclosure;

DETAILED DESCRIPTION

Figure 2A:
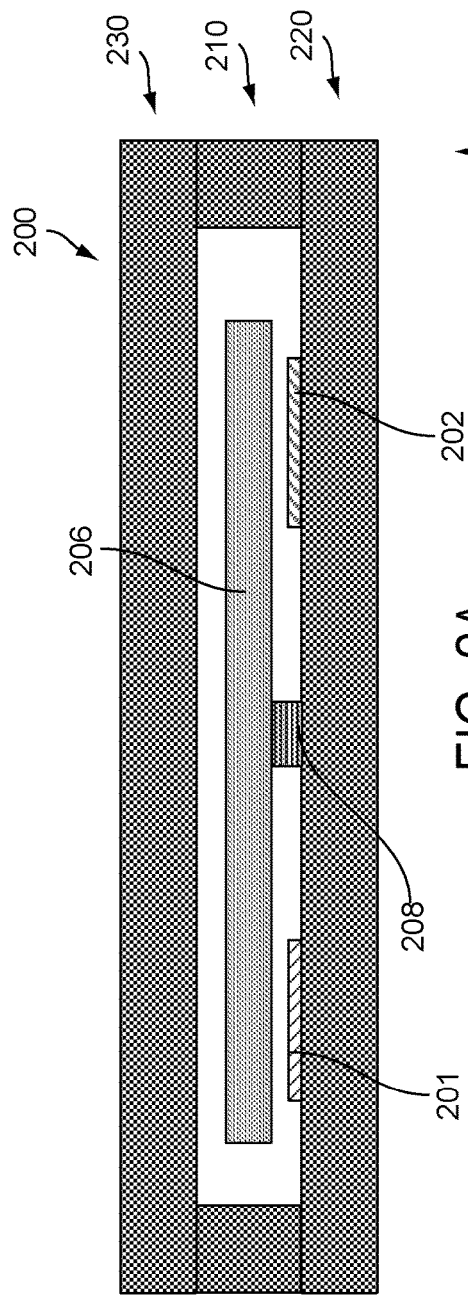
FIG. 2A shows a section view of an illustrative portion of a microelectromechanical (MEMS) inertial sensor having out-of-plane sensing in accordance with some embodiments of the present disclosure.

A MEMS device is constructed of a number of layers such as a CMOS layer, a MEMS device layer, and a cap layer. The MEMS device layer includes a movable proof mass and at least one sense electrode for use in sensing a position or orientation of the proof mass. At least a portion of the proof mass is conductive such that the proof mass and a sense electrode opposing a planar surface of the proof mass form a capacitor. During operation, an operating signal having a voltage, referred to herein as "operating voltage," is applied to the conductive portion of the proof mass or the sense electrode. Motion of the MEMS device causes the proof mass to move with respect to the sense electrode thereby changing the distance between the proof mass and the sense electrode and, hence, changing the capacitance of the capacitor formed by the proof mass and the sense electrode. Processing circuitry measures the capacitance based on signals received from the sense electrode or proof mass, to determine a value indicative of the movement between the proof mass relative and the sense electrode. Based on a change in the capacitance, the processing circuitry determines a motion parameter indicative of motion (e.g., linear acceleration, angular velocity, or magnetic field) of the MEMS device. As an example, the MEMS device may form an accelerometer, gyroscope, pressure sensor, or other type of motion sensor.

The motion parameter may be determined by performing a number of processing operations on the sensed capacitance or capacitances, such as filtering, amplification, scaling, and other analog and/or digital processing operations to generate a signal that is representative of the motion parameter that is desired to be measured. The relationship between any measured capacitance and the sensed motion parameter is based at least in part on known or assumed information about the location and orientation of the proof mass relative to the sense electrode. If one of these components is damaged or the relative location distance and/or orientation between the proof mass and sense electrode otherwise changes, a given capacitance may no longer correspond to a given value for the measured parameter. In many instances it may be difficult to identify such changes based on the measured capacitance or other measurements that can be made with the MEMS sensor, for example, because it may be difficult to determine whether changes in values of a measured capacitance over time are the result of changes in the capacitance system or simply different forces (e.g., inertial forces) applied to the MEMS sensor.

MEMS sensors may be utilized in a variety of applications in which they may be subjected to challenging environmental conditions, such as frequent changes in temperature, exposure to temperature extremes, and sudden changes in temperature. Components of the MEMS sensor may be manufactured of materials that may experience physical stress to such environmental conditions over time, for example, by expanding and contracting as a result of differences in temperature.

For example, sense electrodes that are deposited on a planar substrate layer of a MEMS sensor may define a portion of a capacitor with a proof mass or other movable MEMS component that is located on a plane parallel to the sense electrode. The sense capacitor has a flat planar surface, and the distance between the parallel sense electrode and the proof mass may be designed such that a given capacitance and change in capacitance correspond to a measured motion parameter such as linear acceleration, angular velocity, or magnetic field. The sense electrode may be constructed of materials that may experiences stresses resulting from different environmental conditions. For example, a sense electrode may be manufactured by depositing or sputtering a layer including materials such as aluminum, silicon, copper, gold, tungsten, titanium, titanium nitride, or silicon dioxide. The stresses on the sense electrode may result in a crystallization or cracking of the component materials over time. This cracking changes the behavior of the sense electrode, for example, by changing the electrical characteristics of the sense electrode and creating discontinuities on the previously flat surface facing the sense electrodes. Among other things, these discontinuities may modify the designed distance between the sense electrode and the proof mass, for example, by cause the surface of the sense electrode to extend further in the direction of the sense electrode.

An exemplary sense electrode may include a plurality of slots in the planar surface. The slots may be through slots such that all of the sense electrode is removed along the location of the slot, or may be partial slots that extend a part of the way into the depth of the sense electrode. As cracking occurs within the sense electrode over time, the cracks may couple to the slots of the sense electrode, which may prevent the formation of structures and deformities on the surface of the sense electrode. In this manner, the slots may guide the formation of any cracking in a manner that limits the impact of the cracking on the sensed capacitance.

Sense electrode slotting may reduce a portion of the surface of the electrode that is available for forming a capacitor with the proof mass, or in embodiments of partial slotting, may partially reduce the slotting based on the increased distance between the slotted portions and the proof mass. Accordingly, the slots of the sense electrode may have a variety of patterns and parameters that may be modified or adjusted to select an appropriate electrode design for a particular application. Exemplary patterns may include snaking slots at a variety of orientations, a "T-slot" pattern (e.g., comb pattern), a "Y-slot" pattern (e.g., partial hexagonal pattern), spiral patterns, other suitable patterns, and combinations thereof. Patterns, slot depth, slot width, electrode materials, electrode crystallization patterns, and other similar parameters may be adjusted and selected to create particular desired sensing characteristics and environmental resilience.

In some embodiments, it may be known how a particular slotted electrode design responds to environmental conditions. Parameters for the MEMS sensor (e.g., scaling factors, etc.) may be modified over time based on expected or calculated modifications to the sense electrode over time. Modifications may be made based on factors such as time in service, time in operation, changes in measured parameters over time, and external measured characteristics such as temperature.

FIG. 1 depicts an exemplary motion sensing system 10 in accordance with some embodiments of the present disclosure. Although particular components are depicted in FIG. 1, it will be understood that other suitable combinations of sensors, processing components, memory, and other circuitry may be utilized as necessary for different applications and systems. In an embodiment as described herein, the motion sensing system may include at least a MEMS inertial sensor 12 (e.g., a single or multi-axis accelerometer, a single or multi-axis gyroscope, or combination thereof) and supporting circuitry, such as processing circuitry 14 and memory 16. In some embodiments, one or more additional sensors 18 (e.g., additional MEMS gyroscopes, MEMS accelerometers, MEMS microphones, MEMS pressure sensors, and a compass) may be included within the motion processing system 10 to provide an integrated motion processing unit ("MPU") (e.g., including 3 axes of MEMS gyroscope sensing, 3 axes of MEMS accelerometer sensing, microphone, pressure sensor, and compass).

Processing circuitry 14 may include one or more components providing necessary processing based on the requirements of the motion processing system 10. In some embodiments, processing circuitry 14 may include hardware control logic that may be integrated within a chip of a sensor (e.g., on a substrate or cap of a MEMS inertial sensor 12 or other sensor 18, or on an adjacent portion of a chip to the MEMS inertial sensor 12 or other sensor 18 to control the operation of the MEMS inertial sensor 12 or other sensor 18 and perform aspects of processing for the MEMS inertial sensor 12 or other sensor 18. In some embodiments, the MEMS inertial sensor 12 and other sensors 18 may include one or more registers that allow aspects of the operation of hardware control logic to be modified (e.g., by modifying a value of a register). In some embodiments, processing circuitry 14 may also include a processor such as a microprocessor that executes software instructions, e.g., that are stored in memory 16. The microprocessor may control the operation of the MEMS inertial sensor 12 by interacting with the hardware control logic, and process signals received from MEMS inertial sensor 12. The microprocessor may interact with other sensors in a similar manner.

Although in some embodiments (not depicted in FIG. 1), the MEMS inertial sensor 12 or other sensors 18 may communicate directly with external circuitry (e.g., via a serial bus or direct connection to sensor outputs and control inputs), in an embodiment the processing circuitry 14 may process data received from the MEMS inertial sensor 12 and other sensors 18 and communicate with external components via a communication interface 20 (e.g., a SPI or I2C bus, or in automotive applications, a controller area network (CAN) or Local Interconnect Network (LIN) bus). The processing circuitry 14 may convert signals received from the MEMS inertial sensor 12 and other sensors 18 into appropriate measurement units (e.g., based on settings provided by other computing units communicating over the communication bus 20) and perform more complex processing to determine measurements such as orientation or Euler angles, and in some embodiments, to determine from sensor data whether a particular activity (e.g., walking, running, braking, skidding, rolling, etc.) is taking place.

In some embodiments, certain types of information may be determined based on data from multiple MEMS inertial sensors 12 and other sensors 18, in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications.

An exemplary MEMS inertial sensor (e.g., MEMS inertial sensor 12) may include one or more movable proof masses that are configured in a manner that permits the MEMS inertial sensor (e.g., a MEMS accelerometer or MEMS gyroscope) to measure a desired force (e.g., linear acceleration, angular velocity, magnetic field, etc.) along an axis. In some embodiments, the one or more movable proof masses may be suspended from anchoring points, which may refer to any portion of the MEMS sensor which is fixed, such as an anchor that extends from a layer (e.g., a CMOS layer) that is parallel to the MEMS layer of the device, a frame of the MEMS layer of the device, or any other suitable portion of the MEMS device that is fixed relative to the movable proof masses. The proof masses may be arranged in a manner such that they move in response to measured force. The movement of the proof masses relative to a fixed surface (e.g., a fixed sense electrode extending into the MEMS layer or located parallel to the movable mass on the substrate) in response to the measured force is measured and scaled to determine the desired inertial parameter.

FIG. 2A depicts a section view of a portion of an illustrative inertial sensor 200 that is configured to sense an external force (e.g., a linear acceleration along an axis, an angular velocity about an axis, or a magnetic field) based on out-of-plane movement of a proof mass in accordance with some embodiments of the present disclosure. Although particular components are depicted and configured in a particular manner in FIG. 2A, it will be understood that a motion sensing inertial sensor 200 may include other suitable components and configurations. The section view of FIG. 2A depicts a limited subset of components of a MEMS inertial sensor, which generally include a spring-mass system within a MEMS layer including various components such as springs, proof masses, coupling masses, drive masses, drive electrodes and combs, sense electrodes and combs, lever arms, couplings, and other suitable electromechanical components that are manufactured using semiconductor manufacturing techniques. The set of components depicted in FIG. 2A provide a configuration for out-of-plane capacitive sensing by an inertial sensor. An exemplary MEMS accelerometer may experience a force along the z-axis (i.e., out of the MEMS device plane) in response to a linear acceleration in a direction along that axis. An exemplary gyroscope may experience a force along the z-axis (i.e., out of the MEMS device plane) in response to a Coriolis force along the z-axis as a result of an angular velocity about an axis that is perpendicular to the z-axis and a drive axis of the MEMS gyroscope.

In the embodiment of FIG. 2A, the inertial sensor 200 is constructed of a plurality of bonded semiconductor layers. Although a MEMS device may be constructed in a variety of manners, in an embodiment, the MEMS device may include a substrate 220, a MEMS layer 210, and a cap layer 230 that are bonded together at certain points to form a hermetically sealed package. The substrate 220 may include CMOS circuitry and form a CMOS layer of the MEMS device, though the CMOS circuitry may reside in other portions of the device, such as cap layer 230, or in some embodiments, external to the MEMS die. An exemplary MEMS layer may be produced using semiconductor manufacturing techniques to construct micromechanical components for use in applications such as MEMS sensors (e.g., accelerometers, gyroscopes, pressure sensors, microphones, etc.). An exemplary CMOS layer may provide for the integration of electrical components and devices within the CMOS layer, and may also provide for interconnections between those components. In some embodiments, the components of the MEMS layer 210 may be conductive, and interconnections between components of the MEMS layer 210 and the CMOS layer 220 may be provided. As an example, circuitry within the CMOS layer 220 may electrically couple electrical components (e.g., electrodes or movable proof masses) of the MEMS layer 210 to processing circuitry 14 or other electrical components.

In an exemplary embodiment, the MEMS layer 210 may include at least one anchoring point 208 and at least one movable proof mass 206 that is coupled to the anchoring point 208 and suspended above the substrate 220. The anchoring point 208 may be fixedly attached (e.g., bonded) to and extend from a planar surface of the substrate 220. The anchoring point 208 and the movable proof mass 206 may be composed of conductive material, and the movable proof mass 206 may be arranged to pivot about the anchoring point 208 such that one end of the proof mass 206 tilts up while the other end tilts down in response to an inertial force. Thus, when one side of the proof mass surface moves away from the substrate 220 the other side of the proof mass surface on the opposite end moves toward the substrate 220. Although not depicted in FIG. 2A, springs and couplings may be connected to the proof mass, in-plane anchors, and other components within the MEMS layer in a manner that restricts movement of the proof mass to desired movements in response to measured inertial forces, such as along an axis of a sensed linear acceleration in the case of a MEMS accelerometer or along a Coriolis axis (and in some embodiments, a drive axis) for a MEMS gyroscope.

The proof mass 206 may define a plurality of planar surfaces, including an upper planar surface (top of proof mass 206, in the x/y plane) and a lower planar surface (bottom of proof mass 206, in the x/y plane). Although in different embodiments a proof mass may have a plurality of different shapes within the MEMS device plane, in the exemplary embodiment of FIG. 2A, the proof mass 206 includes at least a left-side planar surface (left side of proof mass 206, in the y/z plane) and a right-side planar surface (right side of proof mass 206, in the y/z plane).

The inertial sensor 200 may also comprise at least one sense electrode that, in conjunction with the proof mass 206, forms a capacitor. The exemplary embodiment of FIG. 2A shows two sense electrodes 201 and 202 positioned on a planar surface of the substrate 220 on opposite sides of the anchoring point 208, but other numbers and arrangements of sense electrodes are possible in other embodiments. Although not depicted in FIG. 2A, in an embodiment an electrode shield may also be formed on the substrate (e.g., surrounding the sense electrodes), and in some embodiments may be of a same or similar material as the sense electrode. Each sense electrode 201 and 202 faces an opposite portion of the lower planar surface of the proof mass 206 that is suspended above the substrate 220. Using these sense electrodes 201 and 202, the position of the proof mass 206 is capacitively sensed. In this regard, the value of the capacitance between sense electrode 201 and the proof mass 206 changes based upon the distance between the upper planar surface of sense electrode 201 and the lower planar surface of proof mass 206. The capacitance between sense electrode 202 and the proof mass 206 changes based upon the distance between the upper planar surface of sense electrode 202 and the lower planar surface of proof mass 206. The capacitance formed by each capacitor may be sensed, and the capacitance signals may be processed (e.g., by filtering, amplification, scaling, etc.) to determine information about the sensed inertial force. In an exemplary embodiment, the memory 16 (FIG. 1) stores data that is used by the processing circuitry 14 in order to convert the sensed voltage into measurements of motion, e.g., linear acceleration, angular velocity, or magnetic field. This data may be calibrated during manufacturing or at other times such that a certain movement by the proof mass 206 corresponds to a certain change in the measured motion parameter.

Figure 2B:
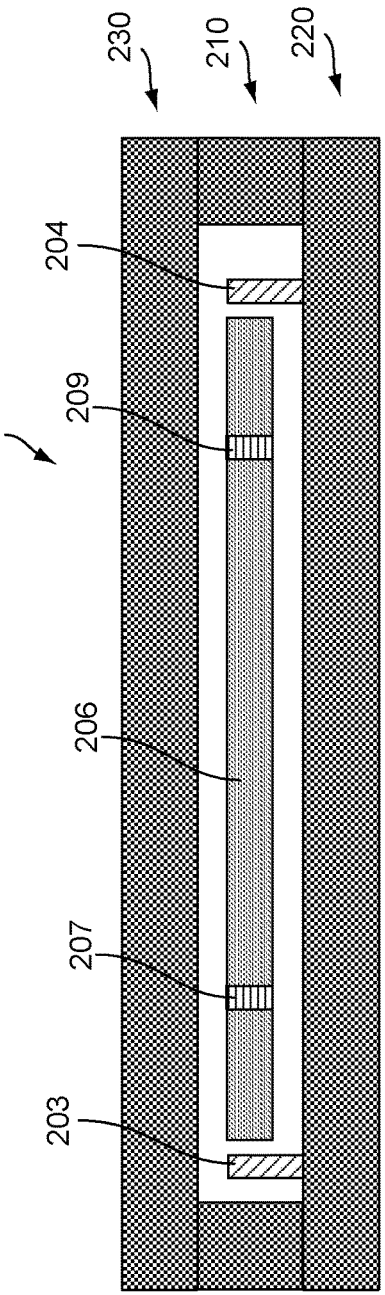
FIG. 2B shows a section view of an illustrative portion of a MEMS inertial sensor having in-plane sensing in accordance with some embodiments of the present disclosure.

FIG. 2B depicts a cross section view of a portion of an illustrative inertial sensor 200 that is configured to sense an external force (e.g., a linear acceleration along an axis, an angular velocity about an axis, or a magnetic field) based on in-plane movement of a proof mass in accordance with some embodiments of the present disclosure. The exemplary inertial sensor 200 includes a substrate 220, a MEMS layer 210, and a cap layer 230, as described above with respect to FIG. 2A. Although particular components are depicted and configured in a particular manner in FIG. 2B, it will be understood that a motion sensing inertial sensor 200 may include other suitable components and configurations. The cross section view of FIG. 2B depicts a limited subset of components of a MEMS inertial sensor, which generally include a spring-mass system within a MEMS layer including various components such as springs, proof masses, coupling masses, drive masses, drive electrodes and combs, sense electrodes and combs, lever arms, couplings, and other suitable electromechanical components that are manufactured using semiconductor manufacturing techniques. The set of components depicted in FIG. 2B provide a configuration for in-plane capacitive sensing by an inertial sensor. An exemplary MEMS accelerometer may experience a force along the x-axis (i.e., within of the MEMS device plane) in response to a linear acceleration in a direction along that axis. An exemplary gyroscope may experience a force along the x-axis (i.e., within of the MEMS device plane) in response to a Coriolis force along the x-axis as a result of an angular velocity about an axis (e.g., the z-axis) that is perpendicular to the x-axis and a drive axis (e.g., the y-axis) of the MEMS gyroscope.

In an exemplary embodiment, the MEMS layer 210 may include at least one movable proof mass 206 that is coupled to a plurality of springs 207 and 209. In an embodiment, the springs 207 and 209 are coupled to the proof mass 206 and other components within the MEMS layer 210 such as coupling masses, drive masses, Coriolis masses, lever arms, anchors, or other suitable components. The springs 207 and 209 are configured in a manner such that they facilitate movement of the proof mass 206 along the sense axis (e.g., x-axis) in response to an inertial force along the sense axis. For example, the springs 207 and 209 may have an aspect ratio and shape such that they are compliant to motion along the x-axis, and in some embodiments, rigid with respect to motion along other axes (e.g., along the y-axis and z-axis). The proof mass 206 may define a plurality of planar surfaces, including an upper planar surface (top of proof mass 206, in the x/y plane) and a lower planar surface (bottom of proof mass 206, in the x/y plane). Although in different embodiments a proof mass may have a plurality of different shapes within the MEMS device plane, in the exemplary embodiment of FIG. 2B, the proof mass 206 includes at least a left-side planar surface (left side of proof mass 206, in the y/z plane) and a right-side planar surface (right side of proof mass 206, in the y/z plane).

The inertial sensor 200 may also comprise at least one sense electrode that, in conjunction with the proof mass 206, forms a capacitor. The exemplary embodiment of FIG. 2B shows two sense electrodes 203 and 204 but other numbers and arrangements of sense electrodes are possible in other embodiments. The sense electrodes 203 and 204 are anchored to the substrate 220 and extend into the MEMS device plane. Sense electrode 203 may include a right-side planar surface, a portion of which is located in the MEMS device plane opposing and parallel to the left-side planar surface of proof mass 206. Sense electrode 204 may include a left-side planar surface, a portion of which is located in the MEMS device plane opposing and parallel to the right-side planar surface of proof mass 206. Using these sense electrodes 203 and 204, the position of the proof mass within the MEMS plane along the x-axis 206 is capacitively sensed. In this regard, the value of the capacitance between sense electrode 203 and the proof mass 206 changes based upon the distance between the right-side planar surface of sense electrode 203 and the left-side planar surface of proof mass 206. The value of the capacitance between sense electrode 203 and the proof mass 206 changes based upon the distance between the left-side planar surface of sense electrode 204 and the left-side planar surface of proof mass 206. The capacitance formed by each capacitor may be sensed, and the capacitance signals may be processed (e.g., by filtering, amplification, scaling, etc.) to determine information about the sensed inertial force. In an exemplary embodiment, the memory 16 (FIG. 1) stores data that is used by the processing circuitry 14 in order to convert the sensed voltage into measurements of motion, e.g., linear acceleration, angular velocity, or magnetic field. This data may be calibrated during manufacturing or at other times such that a certain movement by the proof mass 206 corresponds to a certain change in the measured motion parameter.

FIG. 3A depicts a top view of an exemplary MEMS accelerometer 300 for that responds to a linear acceleration along a z-axis in accordance with some embodiments of the present disclosure. The accelerometer 300 comprises two proof masses PM1 302B and PM2 302A that respond to a linear acceleration along the z-axis by moving in anti-phase direction normal to an upper planar surface of sense electrodes 320A-320D, which are located on a surface of a substrate 306. Although not depicted in FIG. 3A, in an embodiment an electrode shield may also be formed on the substrate (e.g., surrounding the sense electrodes), and in some embodiments may be of a same or similar material as the sense electrode. The anti-phase movement is constrained by a flexible coupling between the two proof masses PM1 302B and PM2 302A and the substrate 306. The flexible coupling comprises two separated anchoring points A1 310A and A2 310B, two central torsional springs B1 314A and B2 314B, two rotational levers L1 316A and L2 316B and four external torsional springs B11 318A, B21 318B, B12 318C and B22 318D. The motion of the accelerometer 300 is measured based on the out-of-plane movement of the proof masses relative to capacitive sense electrodes 320A-320D.

The springs B1 314A and B2 314B connect the anchoring points A1 310A and A2 310B to the levers L1 316A and L2 316B. The four external torsional springs B11 318A, B21 318B, B12 318C and B22 318D connect the end of one lever to the end of the other lever on the opposite side trough the two proof masses PM1 302B and PM2 302A. In particular spring B11 318A connects the top of the left lever L1 316A to internal proof mass PM1 302B that connects the bottom of the right lever L2 316B through the spring B22 318D. In the same way the bottom of the left lever L1 316A is coupled to the top of the right lever L2 316B with the springs B12 318C and B22 318D.

For simplicity, suppose that the proof masses have the center of gravity on the axis of the central springs (B1 314A and B2 314B) and that the external springs (B12 318C, B21 318B, B11 318A and B22 318D) are coupled to the proof masses with the same distance from the center of gravity orthogonal to this axis. A more general case is described in the following.

A linear acceleration a in the Z direction will create a force in Z for each proof mass:

$$F_{PM_1} = m_1 a \tag{9}$$

$$F_{PM_2} = m_2 a \tag{10}$$

where $m_1$ and $m_2$ are the masses of PM1 302B and PM2 302A respectively. On each proof mass half of this force acts on each one of the external springs, B11 318A and B22 318D for PM1 302B, and B12 318C and B21 318B for PM2 302A. This force is transferred on the extreme of the lever so in the center of the lever there is a torque that is the difference of this force times the lever of PM1 302B and PM2 302A:

$$M = \frac{m_1 a}{2} l_{PM1} - \frac{m_2 a}{2} l_{PM2} \tag{11}$$

where the lever length of PM1 $l_{PM1}$ is the distance from the springs B11 318A to B1 314A and B22 318D to B2 314B and $l_{PM2}$ is the distance from the springs B12 318C to B1

314A and B21 318B to B2 314B. The torque M causes the central springs and the two levers to rotate in anti-phase and so one proof mass moves towards the substrate and the other moves in the opposite direction.

In order to cause the anti-phase movement there must be an unbalancing torque M. This unbalanced torque M can be given by a difference in the mass ($m_1 \neq m_2$), by difference in the lever ($l_{PM1} \neq l_{PM2}$), or by a difference in the mass lever product ($m_1 l_{PM1} \neq m_2 l_{PM2}$).

In a more general example, where the center of gravity of the mass is not lying on the spring axis or the external springs are not coupled to proof masses with the same distance orthogonal to this axis, the acceleration causes a torque in addition to the force in the Z direction. In this case the structure of the sensor also rotates. The sensor also includes a sense electrode to measure the motion of the sensor.

As is depicted in FIG. 3A, proof mass PM2 302A may move in a "DOWN" direction along the z-axis relative to and towards the underlying substrate, while proof mass PM1 302B may move in an "UP" direction along the z-axis relative to and away from the underlying substrate. A plurality of sense electrodes 320A-320D may be located on the substrate have an upper planar surface located in parallel and opposite a lower surface of each of the proof masses PM2 302A and PM1 302B. That is, sense electrode 320A may be located opposite a first portion of proof mass PM1 302B, sense electrode 320A may be located opposite a first portion of PM2 302A, sense electrode 320C may be located opposite a second portion of PM2 302A, and sense electrode 320D may be located opposite a second portion of PM1 302B.

Capacitive sensing can be performed based on the capacitance formed by each of the respective electrodes with a portion of the proof mass, such that in the embodiment of FIG. 3A, capacitors associated with sense electrodes 320A/320D and proof mass PM1 302B will have a lower capacitive than capacitors associated with sense electrodes 320B/320C and proof mass PM2 302A, based on the respective distances between the proof masses and sense electrodes.

FIG. 3B shows a side section view of an illustrative MEMS system for sensing linear acceleration in accordance with some embodiments of the present disclosure, viewed from section line 330 of FIG. 3A. FIGS. 3A and 3B depict proof mass PM1 302B as moving away from the underlying substrate in the "UP" direction and proof mass PM2 302A moving towards the underlying substrate in the "DOWN" direction. Sense electrodes 320A (not depicted in FIG. 3B), 320B (not depicted in FIG. 3B), 320C, and 320D are located on the substrate, with 320A and 320B located behind anchors A1 and A2 and sense electrode 320C and 320D located in front of anchors A1 and A2. Each of the sense electrodes is connected to a sense path (e.g., within CMOS circuitry of the substrate) that includes analog and digital circuitry such as a C-to-V converters, amplifiers, comparators, filters, and scaling to determine acceleration based on the capacitances sensed by the sense electrodes.

A first portion of poof mass PM2 302A is located in front of anchor A1 and directly above sense electrode 320C to form a capacitor therewith, the capacitance of which increases based on the movement of the first portion of proof mass PM2 302A towards sense electrode 320C. A second portion of poof mass PM2 302A is located behind anchor A2 and directly above sense electrode 320B (behind sense electrode 320D, not depicted) to form a capacitor therewith, the capacitance of which increases based on the movement of the second portion of proof mass PM2 302A towards sense electrode 320B. A first portion of poof mass PM1 302B is located in front of anchor A2 and directly above sense electrode 320D to form a capacitor therewith, the capacitance of which decreases based on the movement of the first portion of proof mass PM1 302B away from sense electrode 320D. A second portion of poof mass PM1 302B is located behind anchor A1 and directly above sense electrode 320A (behind sense electrode 320C, not depicted) to form a capacitor therewith, the capacitance of which decreases based on the movement of the second portion of proof mass PM1 302B away from sense electrode 320A.

Figure 4:
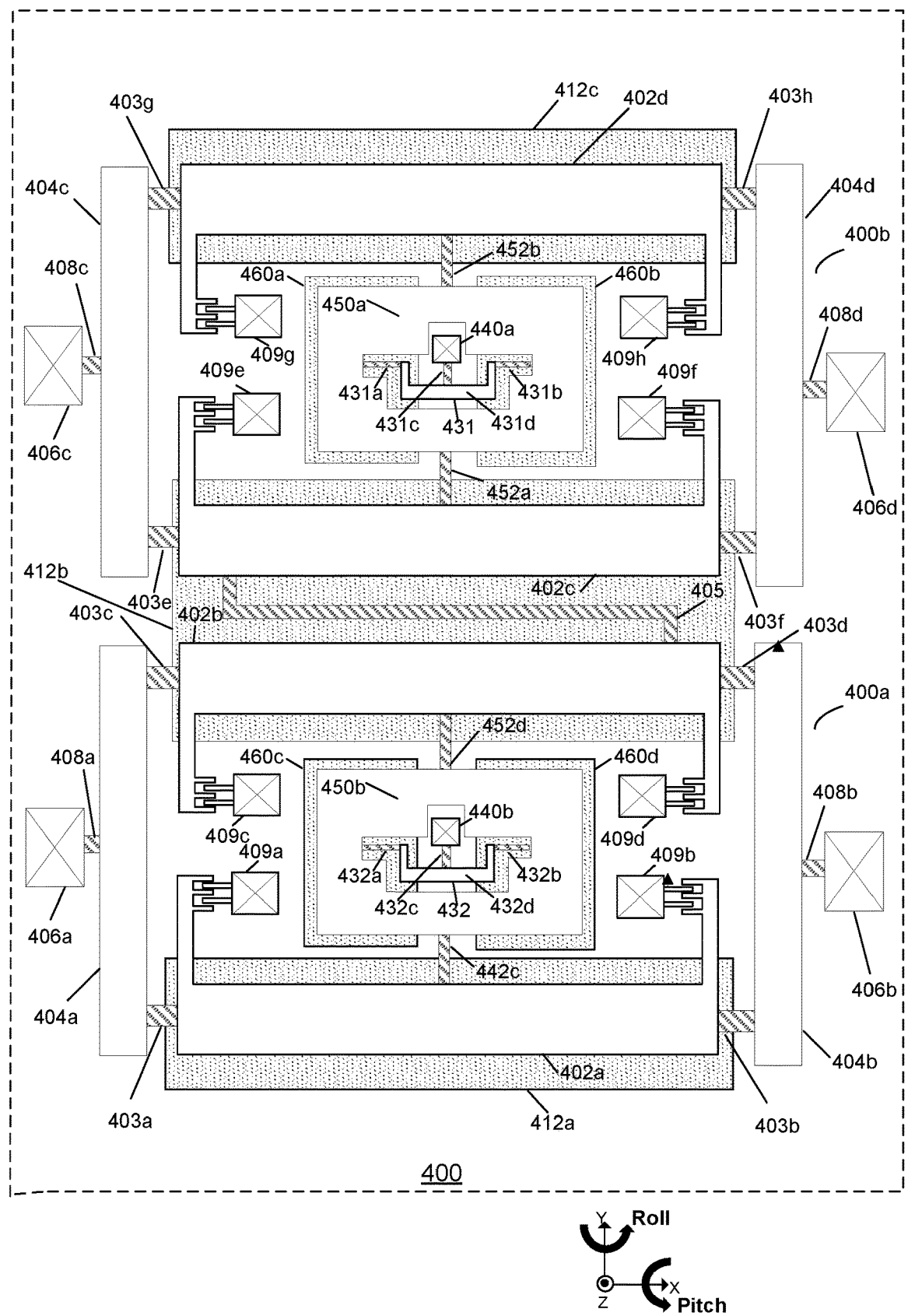
FIG. 4 shows an illustrative system for sensing angular velocity in accordance with some embodiments of the present disclosure.

FIG. 4 depicts an illustrative MEMS gyroscope with voltage sensing of multiple movable masses relative to sense electrodes in accordance with some embodiments of the present disclosure. The gyroscope design of FIG. 4 is provided for purposes of illustration and not limitation. It will be understood that the principles of the present disclosure may apply to any suitable MEMS device (e.g., MEMS accelerometers, gyroscopes, pressure sensors, microphones, etc.) and to any suitable configuration of such devices. The exemplary embodiment of FIG. 4 illustrates an embodiment of a dual-axis gyroscope comprising a balanced guided mass system 400. The guided mass system 400 comprises two guided mass systems 400a and 400b coupled together by coupling spring 405.

The guided mass systems 400a and 400b are connected to anchoring points 406a-d via springs 408a-d. Additional anchoring points 440a and 440b are located within the interior of the pitch proof masses 450a and 450b. Located below the MEMS layer of the suspended spring-mass system depicted in FIG. 4 is substrate CMOS layer 401. Each of the anchoring points 406a-d and 440a-b may be bonded to the CMOS layer 401 (e.g., via respective connecting points) and may extended upwards into the plane of the suspended spring-mass system.

The symmetric guided mass system 400a rotates out-of-plane about a first roll-sense axis. The symmetric guided mass system 400b rotates out-of-plane about a second roll-sense axis in-plane and parallel to the first roll-sense axis. The coupling spring 405 is connected to roll proof-masses 402b and 402c. The coupling spring 405 is torsionally compliant about an axis in the X-direction so that the symmetric guided mass systems 400a and 400b can rotate anti-phase out-of-plane about the first and second roll-sense axes. The coupling spring 405 is stiff in the Z-direction which prevents the symmetric guided mass systems 400a and 400b from rotating in-phase out-of-plane.

In an embodiment, pitch proof-masses 450a and 450b are each flexibly connected to their respective four roll proof-masses 402a-402d via springs 4201a-d. Springs 4201a and 4201b are torsionally compliant such that pitch proof-mass 450a can rotate out-of-plane about a first pitch sense axis in the y-direction, and springs 4201c and 4201d are torsionally compliant such that pitch proof-mass 450b can rotate out-of-plane about a second pitch sense axis in the Y-direction.

In this embodiment, proof masses 450a and 450b are also coupled to the CMOS layer 401 via spring systems 431 and 432, and anchoring points 440a and 440b, respectively. Pitch proof-masses 450a and 450b follow the motion of the CMOS layer 401 substrate and the vertical gap between the substrate and the proof masses remain same even under the external effects like temperature variations and externally applied forces.

The two symmetric guided mass systems 400a and 400b are arranged so that the roll proof-masses 402a-d move along the x-axis in anti-phase. The coupling spring 405 is stiff in the X-direction such that roll proof-masses 402b and 402c move together in the X-direction. The roll proof-masses 402a and 402d move in opposite of roll proof-masses 402b and 402c.

Springs 4201a-d are compliant in-plane such that when the roll proof-masses 402a-d are driven, the pitch proof-masses 450a and 450b rotate anti-phase in-plane about separate axes in the z-direction. Electrostatic actuators 409a-h such as comb drives are connected to the roll proof-masses 402a-d to drive the balanced guided mass system 400. The two guided mass systems 400a and 400b comprising roll proof-masses 402a-d and pitch proof-masses 450a and 450b are driven together at a frequency by a drive circuit coupled to the actuators 409a-h. In some embodiments, drive sense electrodes (not depicted) may be connected to any of the components of the gyroscope to detect the drive response to a particular actuation/drive that is provided to the system. The measurements from the drive sense electrodes may be used as feedback to adjust the actuation that is provided to the system.

Angular velocity about the pitch-input axis in the x-direction will cause Coriolis forces to act on the pitch proof-masses 450a and 450b about the first and second pitch-sense axes respectively. The Coriolis forces cause the pitch proof masses 450a and 450b to rotate anti-phase out-of-plane about the first and the second pitch-sense axes. The amplitudes of the rotations of the pitch proof-masses 450a and 450b about the first and the second pitch-sense axes are proportional to the angular velocity about the pitch-input axis.

In an embodiment, sense electrodes 460a-460d located on the substrate and under the pitch proof masses 450a and 450b are used to detect the anti-phase rotations about the first and the second pitch-sense axes. Although not depicted in FIG. 4, in an embodiment an electrode shield may also be formed on the substrate (e.g., surrounding the sense electrodes), and in some embodiments may be of a same or similar material as the sense electrode. Externally applied angular acceleration about the roll-input axis will generate inertial torques in-phase on the pitch proof masses 450a and 450b causing them to rotate in-phase about the first and the second pitch-sense axes. Sense electrodes 460a and 460d can be coupled and sense electrodes 460b and 460c can be coupled so that in-phase rotations of the pitch proof-masses 450a and 450b are not detected, but anti-phase rotations are detected.

Angular velocity about the roll-input axis will cause Coriolis forces to act on the roll proof-masses 402a-d in the Z-direction. The Coriolis forces cause the symmetric guided mass systems 400a and 400b to rotate anti-phase out-of-plane about the first and second roll-sense axes. Sense electrodes 412a-c under the roll proof masses 402a-d are used to detect the rotations of the symmetric guided mass systems 400a and 400b. Externally applied angular acceleration about the pitch-input axis will generate in-phase inertial torques on the symmetric guided mass systems 400a and 400b.

However, the symmetric guided mass systems 400a and 400b do not rotate because coupling spring 405 prevents in-phase rotation about the first and second roll-sense axes. Sense electrodes 412a and 412c can be coupled so that in-phase rotations of the symmetric guided mass systems 400a and 400b are not detected but anti-phase rotations are detected.

Figure 5A:
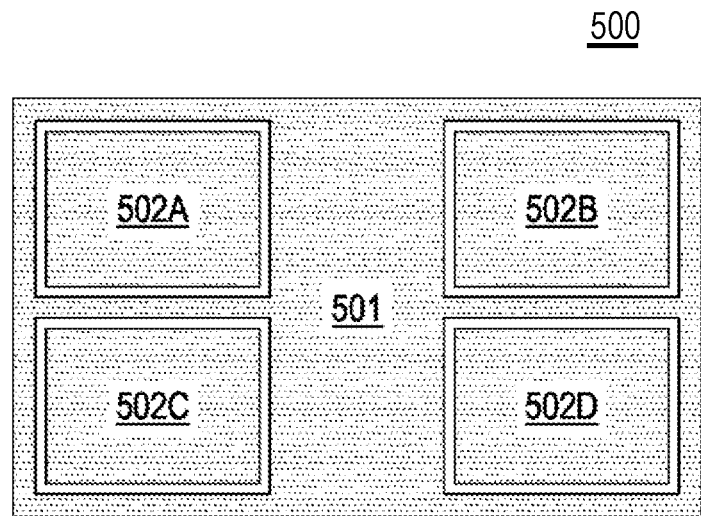
FIG. 5A shows an exemplary configuration of sense electrodes located on a plane of a substrate in accordance with some embodiments of the present disclosure.

FIG. 5A shows an exemplary configuration of sense electrodes located on a plane of a substrate in accordance with some embodiments of the present disclosure. Although a variety of sense electrode configurations may be provided for different suitable applications, in an embodiment four rectangular sense electrodes 502A-502D may be provided on a substrate to perform capacitive sensing for an inertial sensor. Substrate 500 may be a suitable substrate, such as a CMOS substrate as described herein. An electrode shield 501 may be formed on the substrate 500. The electrode shield 501 may shield the sense electrodes from other components system (e.g., other than the measured proof mass), which may improve the accuracy of the capacitive measurements performed by the sense electrodes 502A-502D. Non-conductive gaps may be provided between the electrode shield 501 and the sense electrodes 502A-502D, such that each sense electrode 502A-502D provides an isolated and continuous conductive pad for capacitive interaction with its associated proof mass or proof mass portion.

Figure 5B:
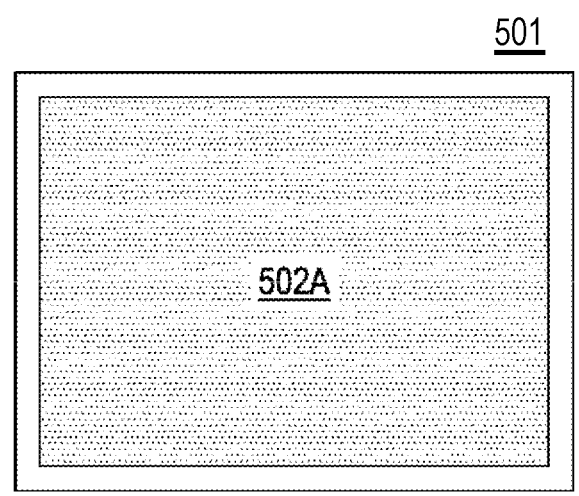
FIG. 5B shows an exemplary one of the sense electrodes of FIG. 5A in accordance with some embodiments of the present disclosure.

FIG. 5B shows an exemplary one of the sense electrodes of FIG. 5A in accordance with some embodiments of the present disclosure. Sense electrode 502A is a continuous rectangular sense electrode, and is surrounded by electrode shield 501 with an intervening non-conductive gap. In the embodiments of FIGS. 5A-5B, the components of the MEMS sensor (e.g., electrode shield 501 and sense electrodes 502A-502D) may not have been exposed to environmental conditions that result in changes to the materials of those components. Thus, the components may be substantially in a form that is similar to the manner in which they were deposited, with generally smooth exposed surfaces (e.g., of the sense electrode 502A-502D facing the proof masses).

Figure 5C:
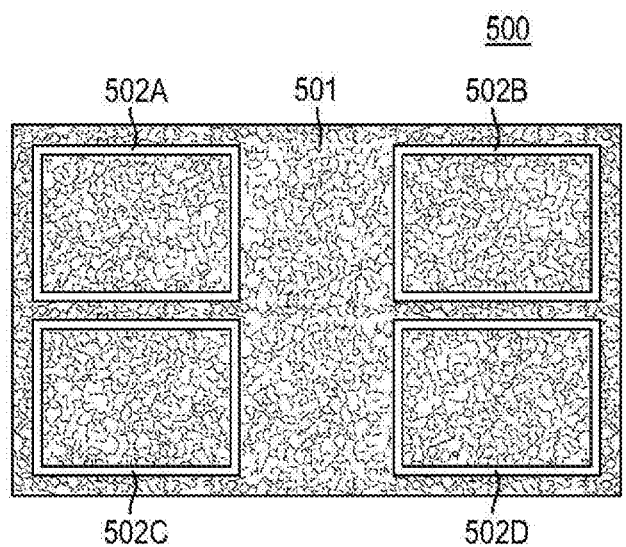
FIG. 5C shows the sense electrode configuration of FIG. 5A after extended exposure to an operating environment in accordance with some embodiments of the present disclosure.
Figure 5D:
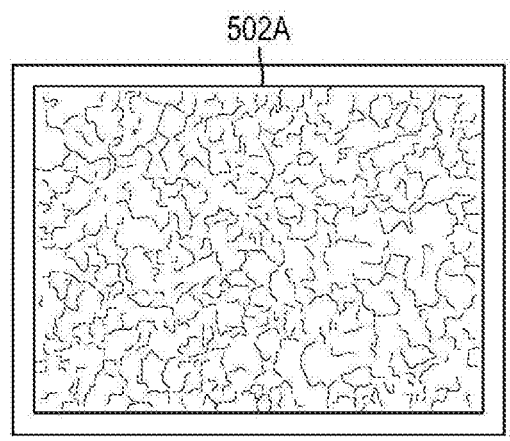
FIG. 5D shows an exemplary one of the sense electrodes of FIG. 5C in accordance with some embodiments of the present disclosure.
Figure 5E:
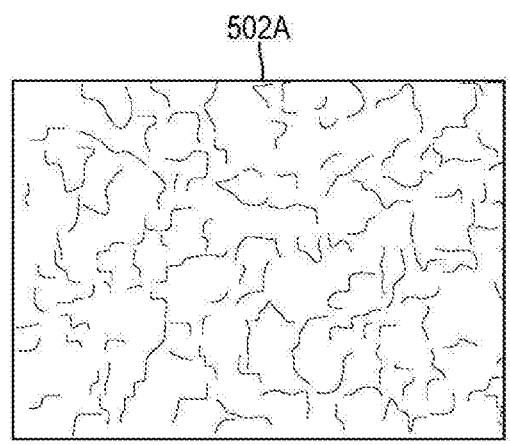
FIG. 5E shows an exemplary detail view of a portion of the sense electrode of FIG. 5D in accordance with some embodiments of the present disclosure.

FIG. 5C depicts the exemplary sense electrodes and electrode shield of FIG. 5A after extended exposure to environmental conditions. Over time, exposure to environmental conditions such as temperature extremes or sudden changes in temperature may impact the physical structure of the constituent materials of the electrode shield 501 and sense electrodes 502A-D, resulting in formation of cracking patterns, including at the surface of the electrode shield 501 and sense electrodes 502A-502D. In the exemplary embodiment of FIGS. 5A-5E, the electrode shield 501 and sense electrodes 502A-502D may be impacted in a similar manner, such that the cracking pattern is relatively uniform throughout the electrode shield 501 and sense electrodes 502A-502D. This pattern is depicted in more detail for an exemplary sense electrode 502A in FIG. 5D, and with additional detail of the sense electrode 502A depicted in FIG. 5E.

The cracking pattern that forms on the sense electrodes 502A-502D may result in surface effects that modify the electrical characteristics, and thus, the resulting capacitive signals, that are sensed based on the capacitors of the sense electrodes 502A-502D and their respective proof masses. In addition, the cracking may also result in variations of the height of the sense electrodes or portions thereof relative to the proof masses, which may result in a change in the capacitive response of the MEMS inertial sensor. This may result in inaccurate readings of the sensed parameter, since a given sensed parameter may be based on an assumed correspondence with a particular capacitance (e.g., based on filtering, amplification, scaling, and other processing as described herein).

Figure 6A:
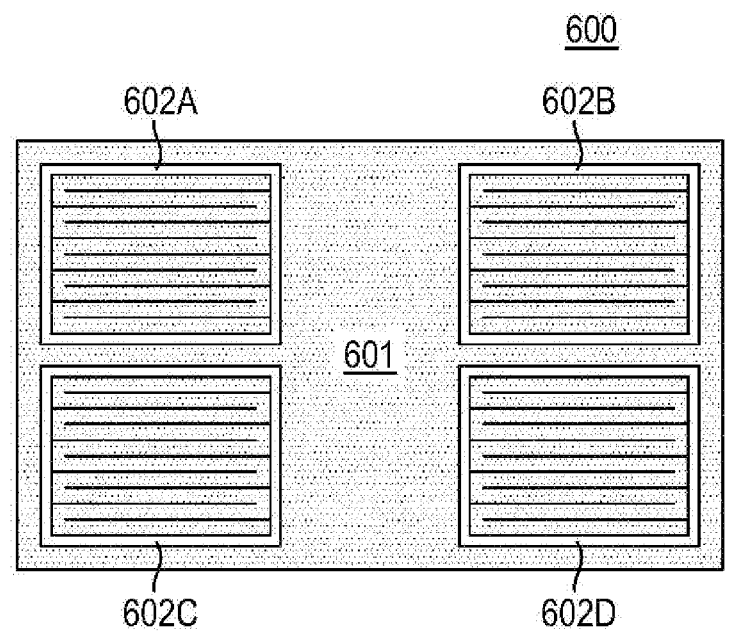
FIG. 6A shows an exemplary configuration of parallel-slotted sense electrodes located on a plane of a substrate in accordance with some embodiments of the present disclosure.

FIG. 6A shows an exemplary configuration of parallel-slotted sense electrodes located on a plane of a substrate in accordance with some embodiments of the present disclosure. Although a variety of sense electrode configurations may be provided for different suitable applications, in an embodiment four slotted rectangular sense electrodes 602A-602D may be provided on a substrate to perform capacitive sensing for an inertial sensor. Substrate 600 may be a suitable substrate, such as a CMOS substrate as described herein. An electrode shield 601 may be formed on the substrate 600. The electrode shield 601 may shield the slotted sense electrodes from other components system (e.g., other than the measured proof mass), which may improve the accuracy of the capacitive measurements performed by the slotted sense electrodes 602A-602D. Non-conductive gaps may be provided between the electrode shield 601 and the slotted sense electrodes 602A-602D, such that each slotted sense electrode 602A-602D provides an isolated and continuous conductive pad for capacitive interaction with its associated proof mass or proof mass portion.

Although slotted sense electrodes may be configured in a variety of manners, in an embodiment of FIG. 6A, the slotted sense electrodes may have a plurality of parallel slots that form a continuous "snaking" pattern that maintains a continuous conductive path for the slotted sense electrodes 602A-602D. A variety of parameters for the slotted sense electrodes may be modified based on desired design factors, such as to optimize the operational surface area of the sense electrode while limiting the impact of environmental conditions on the operation of the sense electrode. Exemplary factors that may be modified include number of slots, slot width, slot depth (e.g., with recessed slots as described herein), slot shapes, etc. In some embodiments, these design factors may be optimized for particular electrode materials and/or different expected environment conditions, for example, based on different expected material structures and expected cracking patterns. In some embodiments, it may be desirable to configure a slotted structure so that it provides relief for the material to expand in-plane which limits the undesirable out-of-plane change caused from cracking. In some embodiments, different sense electrodes within a single device may have different patterns based on different electrode shapes, sizes, and materials for a particular application.

Figure 6B:
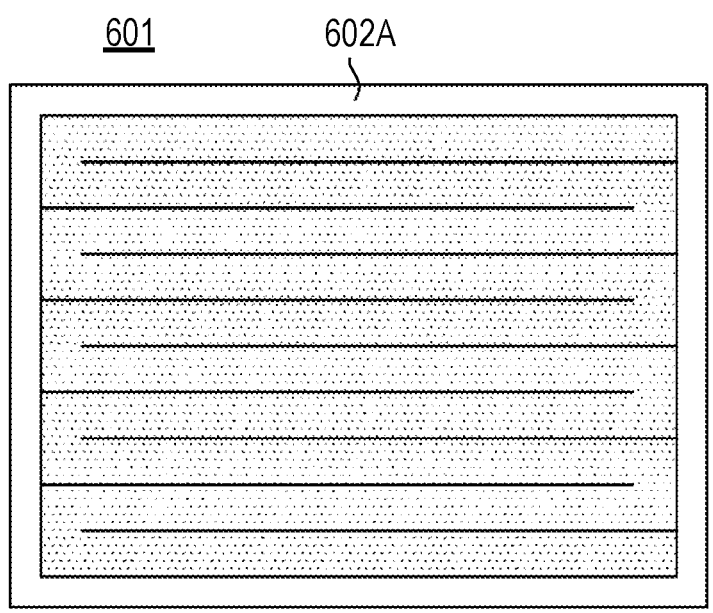
FIG. 6B shows an exemplary one of the parallel-slotted sense electrodes of FIG. 5A in accordance with some embodiments of the present disclosure.

FIG. 6B shows an exemplary one of the slotted sense electrodes of FIG. 6A in accordance with some embodiments of the present disclosure. Sense electrode 602A is a slotted rectangular sense electrode, and is surrounded by electrode shield 601 with an intervening non-conductive gap. In the embodiments of FIGS. 6A-6B, the components of the MEMS sensor (e.g., electrode shield 601 and slotted sense electrodes 602A-602D) may not have been exposed to environmental conditions that result in changes to the materials of those components. Thus, the components may be substantially in a form that is similar to the manner in which they were deposited, with generally smooth exposed surfaces (e.g., of the sense electrode 602A-602D facing the proof masses).

Figure 6C:
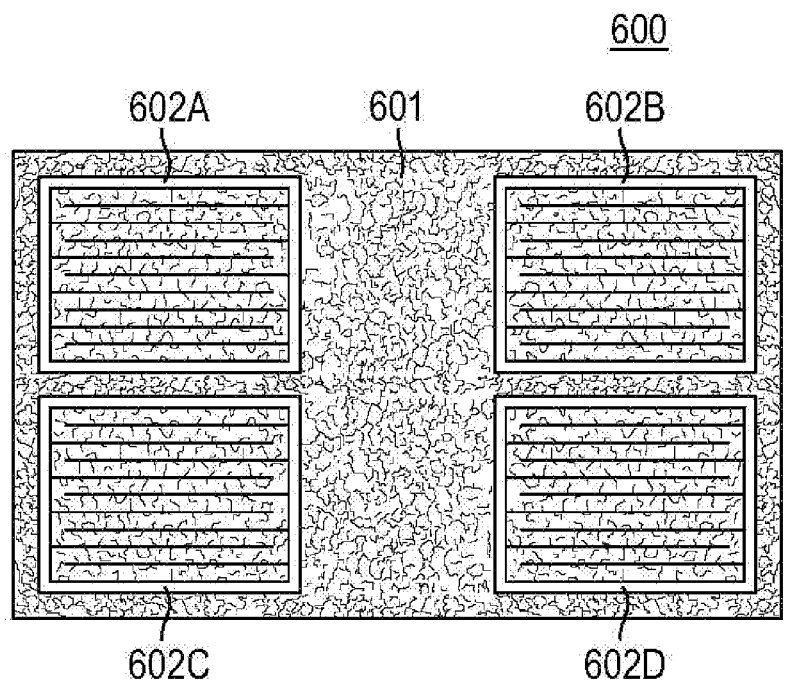
FIG. 6C shows the parallel-slotted sense electrode configuration of FIG. 5A after extended exposure to an operating environment in accordance with some embodiments of the present disclosure.
Figure 6D:
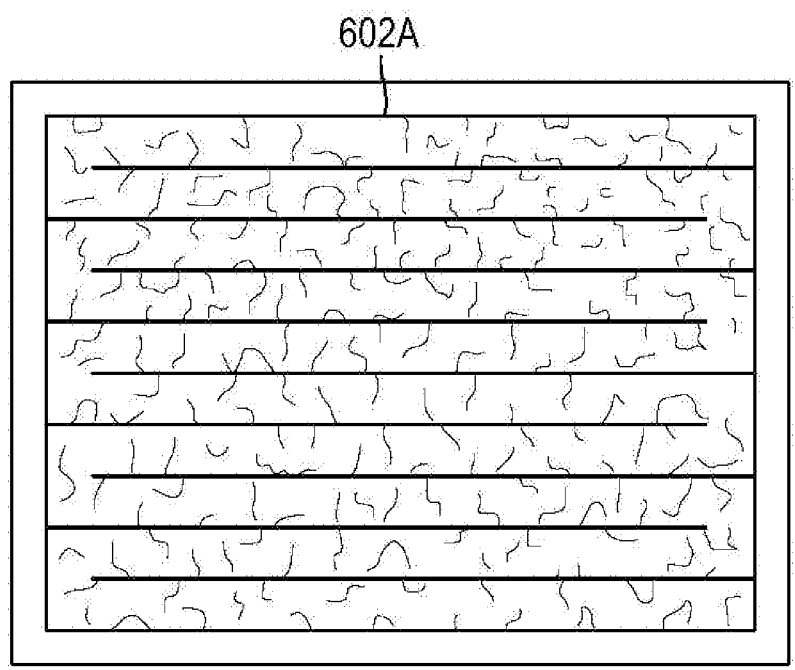
FIG. 6D shows an exemplary one of the parallel-slotted sense electrodes of FIG. 5C in accordance with some embodiments of the present disclosure.
Figure 6E:
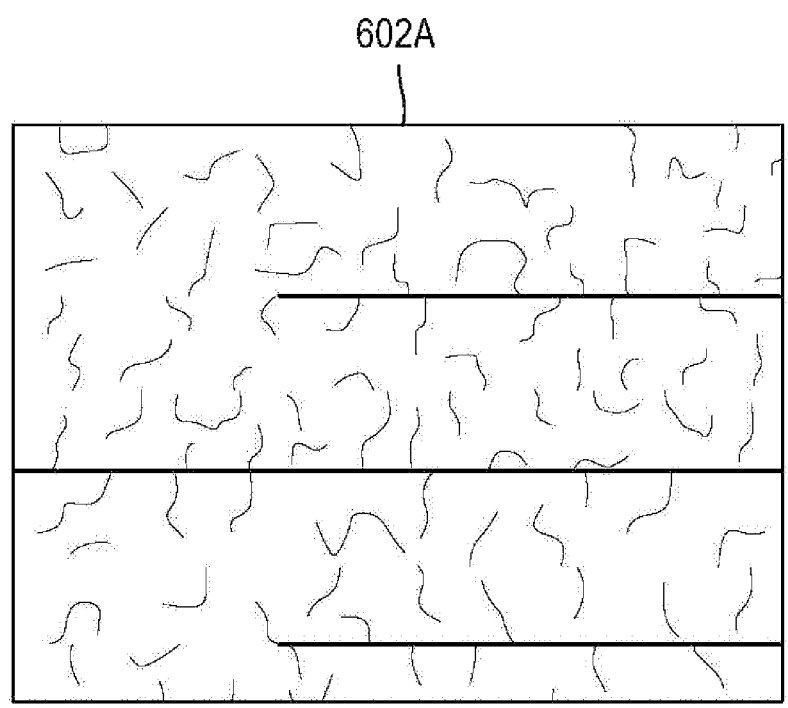
FIG. 6E shows an exemplary detail view of a portion of the parallel-slotted sense electrode of FIG. 5D in accordance with some embodiments of the present disclosure.

FIG. 6C depicts the exemplary slotted sense electrodes and electrode shield of FIG. 6A after extended exposure to environmental conditions. Over time, exposure to environmental conditions such as temperature extremes or sudden changes in temperature may impact the physical structure of the constituent materials of the electrode shield 601 and slotted sense electrodes 602A-D, resulting in formation of cracking patterns, including at the surface of the electrode shield 601 and sense electrodes 602A-602D. In the exemplary embodiment of FIGS. 6A-6E, the electrode shield 601 and sense electrodes 602A-602D may not crack uniformly, such that the cracking pattern of the electrode shield 601 is significantly denser than the cracking pattern experienced by the sense electrodes 602A-602D. As described herein, the slots may be designed such that the cracking pattern is less likely to form complete structures (e.g., based on crystalline structures formed by the electrode materials), preventing additional cracking and lessening the impact of the cracking on the sensitivity of the capacitor that is formed by the respective slotted sense electrodes. This pattern of reduced cracking in the slotted regions is depicted in more detail for an exemplary sense electrode 602A in FIG. 6D, and with additional detail of the sense electrode 602A depicted in FIG. 6E.

The cracking pattern that forms on the sense electrodes 602A-602D may result in surface effects that modify the electrical characteristics, and thus, the resulting capacitive signals, that are sensed based on the capacitors of the sense electrodes 602A-602D and their respective proof masses. However, because the slotting reduces the degree of cracking within the sense electrode regions, changes to the sensitivity of the capacitor are also reduced. The changes to the sensitivity may be less than a threshold sensitivity difference, or a useful life of the sensor may thus be extended. In some embodiments, parameters of the MEMS sensor may be measured such that predicted changes in sensor sensitivity may be estimated and compensation may be performed.

FIGS. 7A-7E depict a variety of slotted sense electrode patterns in accordance with the present disclosure. The patterns depicted herein are exemplary only, and it will be understood that any of the electrode patterns depicted herein may be combined or modified in an appropriate manner, and that additional patterns may be utilized in accordance with the present disclosure. In embodiments, parameters for patterns such as slot width, slot density, slot depth, and slot orientation may be modified in order to meet desired characteristics related to electrical function (e.g., capacitive sensing) and resistance to cracking or other environmental effects. In some embodiments, factors such as typical crack shape and size (e.g., for particular constituent materials of the sense electrode) and electrode coverage (e.g., to maintain a desired amount of electrode materials or surface area, such as between at least 20% or less of non-slotted material and/or surface area) may be utilized to set the parameters.

Figure 7A:
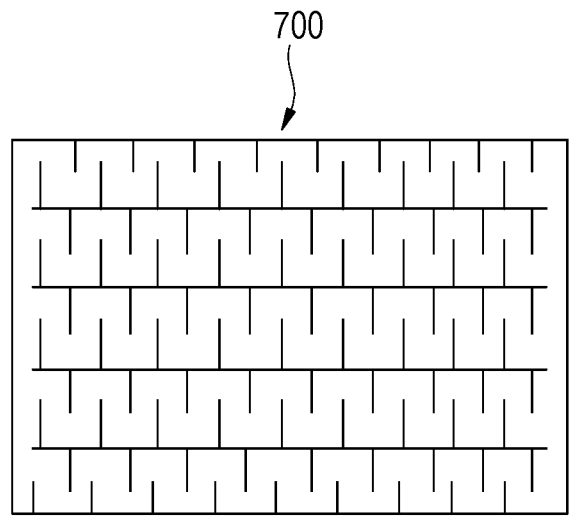
FIG. 7A depicts an exemplary "T-slot" sense electrode slotting pattern in accordance with some embodiments of the present disclosure.

FIG. 7A depicts an exemplary "T-slot" sense electrode slotting pattern 700 in accordance with some embodiments of the present disclosure. The exemplary T-slot pattern may include a plurality of slots running in a direction (e.g., length-wise, width-wise, angled, or in other directions) in a pattern (e.g., parallel, as depicted in FIG. 7A). A plurality of slot stubs may extend from each of the slots, forming a T-slot pattern that may provide additional slotted for interfacing with a cracking pattern, and thus, reducing the overall density of the cracking pattern and formation of crystalline deformations within the sense electrode.

Figure 7B:
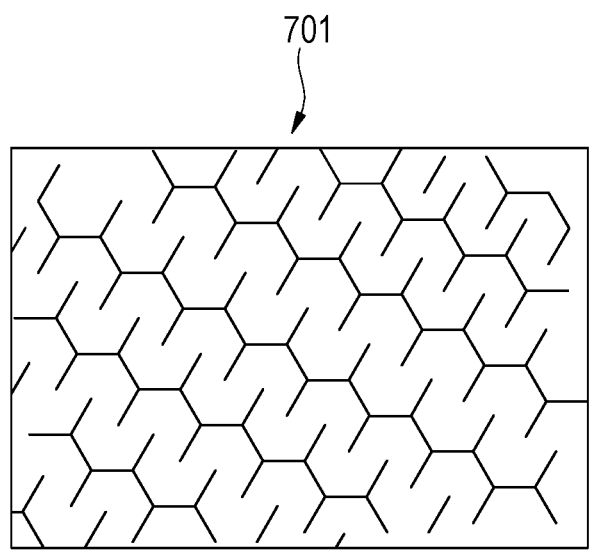
FIG. 7B depicts an exemplary "Y-slot" sense electrode slotting pattern in accordance with some embodiments of the present disclosure.

FIG. 7B depicts an exemplary "Y-slot" sense electrode slotting pattern 701 in accordance with some embodiments of the present disclosure. For some material combinations of a sense electrode, likely crystalline patterns and sizes may be known. In some embodiments, it may be desirable to design slot structures that accommodate a known cracking pattern, and thus, reduce the overall density of the cracking pattern and formation of crystalline deformations within the sense electrode. A Y-slot slotting pattern may provide a series of interconnected 120° angles that approximate a likely cracking pattern, thus limiting the degree of material cracking that is included within the electrode material of the sense electrode.

Figure 7C:
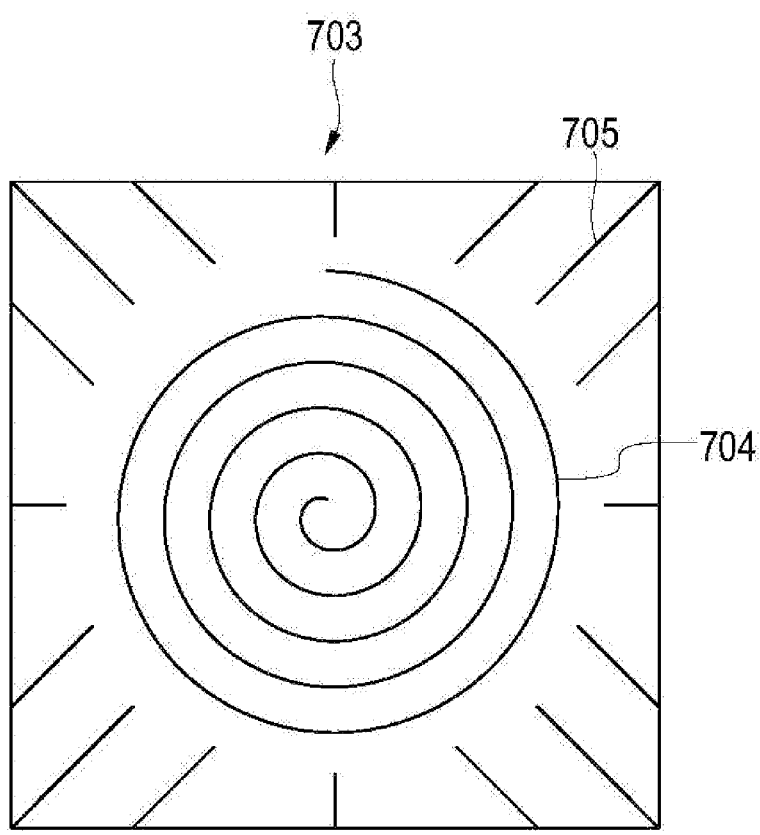
FIG. 7C depicts an exemplary "spiral-slot" sense electrode slotting pattern in accordance with some embodiments of the present disclosure.

As described herein, a variety of slotting shapes may be implemented in accordance with the present disclosure, and multiple slotting shapes may be combined as desired. FIG. 7C depicts an exemplary "spiral-slot" sense electrode slotting pattern 702 in accordance with some embodiments of the present disclosure. A spiral slot 704 begins from the center of the sense electrode, and in an embodiment, extends therefrom with a uniform distance between slots while maintaining electrical conductivity. In an exemplary rectangular electrode as depicted in FIG. 7C, an additional set of linear peripheral slots 705 may extend from the outer surface of the electrode to provide additional electrode slotting. However, it will be understood that additional electrode slot may not be utilized in other spiral-slotting embodiments.

Figure 7D:
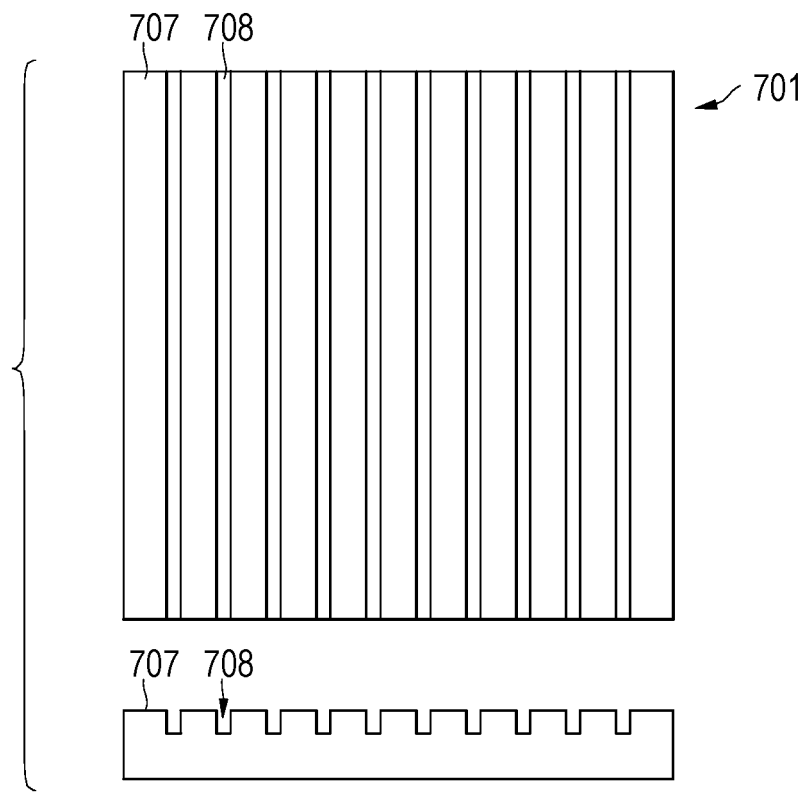
FIG. 7D depicts an exemplary "recessed-slot" sense electrode slotting pattern in accordance with some embodiments of the present disclosure.

FIG. 7D depicts an exemplary top and side view of a "recessed-slot" sense electrode slotting pattern 706 in accordance with some embodiments of the present disclosure. Rather than providing through-slots in which all of the sense electrode material is removed through to the surface of the substrate, a set of slots 708 may be recessed such that they still include electrode material but are below the upper surface of the sense electrode 707. In this manner, electrical conductivity may be maintained throughout the sense electrode, which may permit a variety of suitable patterns to be implemented on the surface of the sense electrode (e.g., parallel, Y-slot, T-slot, spiral, combinations thereof, other complex patterns, etc.). Recessed slotting may also facilitate additional surface slotting while maintaining a desired amount of electrode material. Slot recessing may be provided at a variety of suitable depths, such as 5%, 20%, 50%, or 80% of overall sense electrode depth.

Figure 7E:
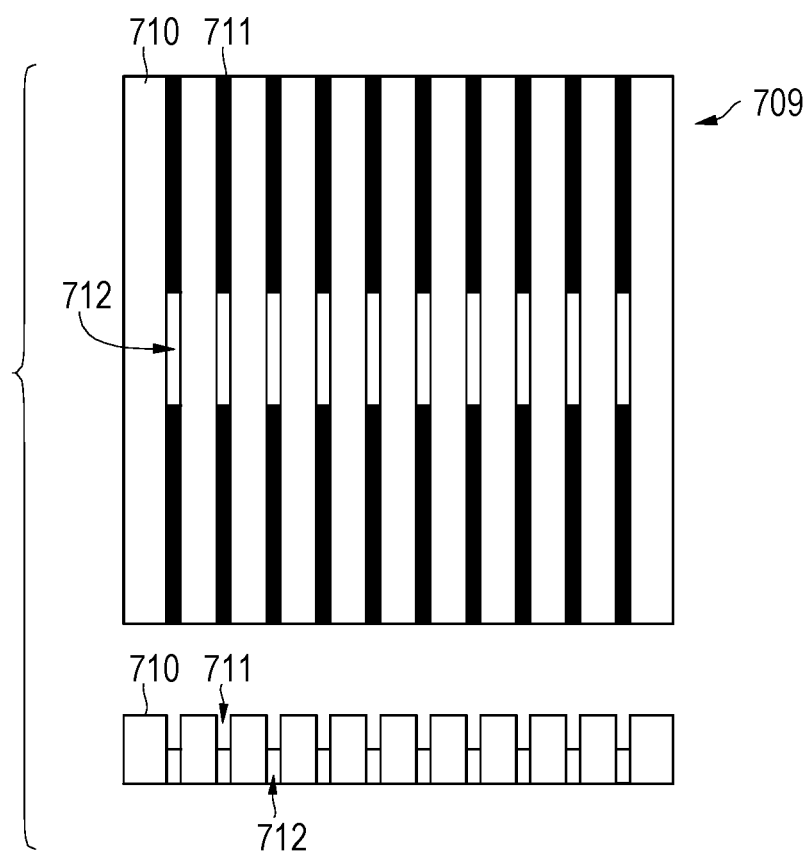
FIG. 7E depicts an exemplary "connected-slot" sense electrode slotting pattern in accordance with some embodiments of the present disclosure.

FIG. 7E depicts an exemplary top and side view of a "connected-slot" sense electrode slotting pattern 709 in accordance with some embodiments of the present disclosure. A connected slot pattern may provide connecting portions 712 between spanning through-slots 711 between portions of the sense electrode 710. In this manner, electrical conductivity may be maintained throughout the sense electrode, which may permit a variety of suitable through-slot patterns to be implemented on the surface of the sense electrode (e.g., parallel, Y-slot, T-slot, spiral, combinations thereof, other complex patterns, etc.). In the exemplary embodiment of FIG. 7E, the connecting portions 712 may be recessed with respect to the top surface 711 of the sense electrode 709, although other patterns (e.g., full thickness) may be employed in other embodiments.

Figure 8:
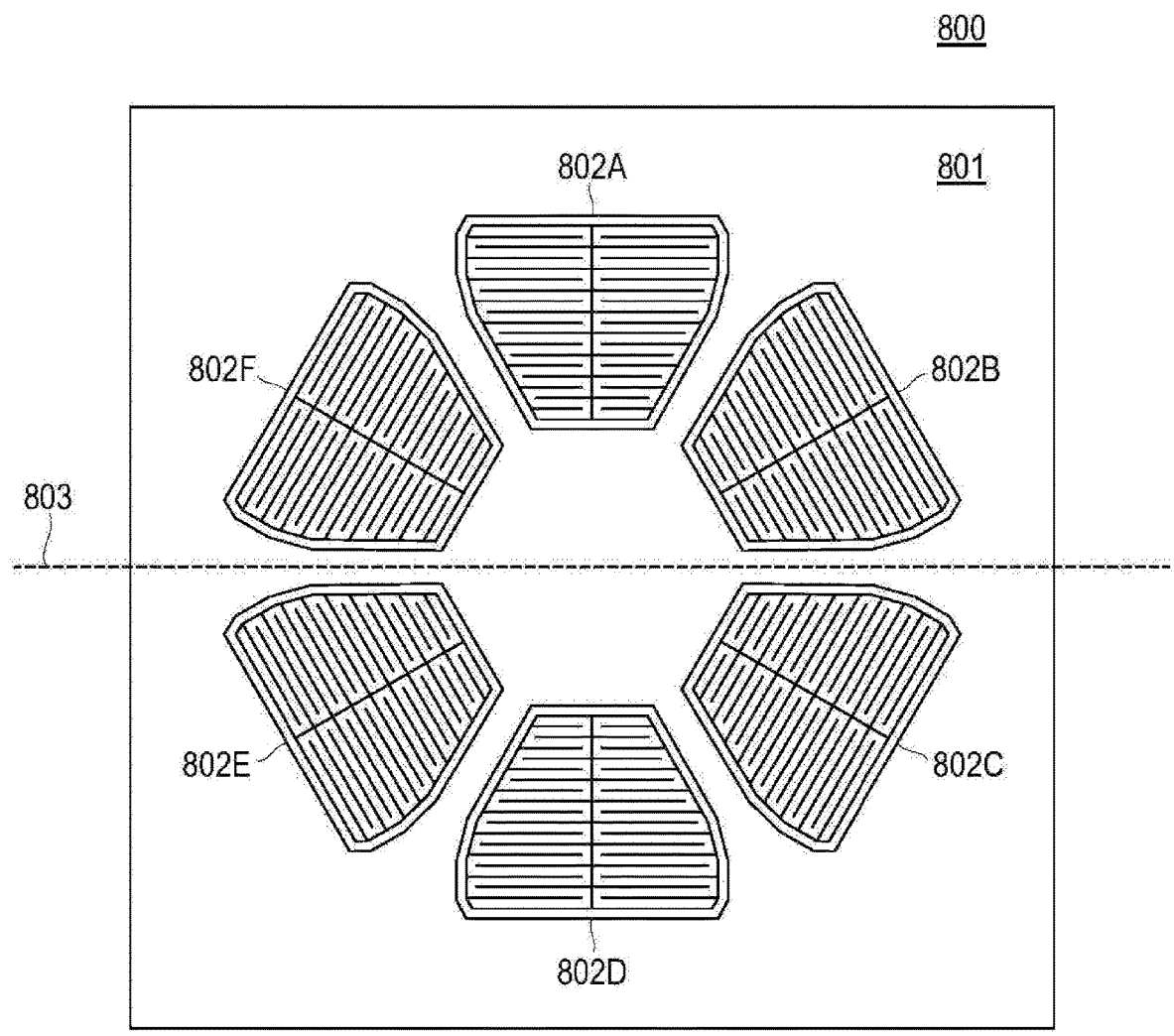
FIG. 8 depicts an exemplary layer of slotted sense electrodes of an exemplary accelerometer in accordance with some embodiments of the present disclosure.

FIG. 8 depicts an exemplary layer of slotted sense electrodes of an exemplary accelerometer 800 in accordance with some embodiments of the present disclosure. In an embodiment, an electrode shield 801 have similar or the same thickness and material as each of electrodes 802A-802F. In the exemplary embodiment of FIG. 8, each of the sense electrodes 802A-802F of the accelerometer 800 may be associated with a respective proof mass that moves out-of-plane towards or away from its associated sense electrode 802A-802F to change a capacitance in response to rotation about a sensed axis. Although in some embodiments, one or more of the sense electrodes may have a different shape or pattern based on the MEMS sensor design, in an embodiment each of the sense electrodes of the MEMS sensor of FIG. 8 may have a similar shape and may include a similar slotting pattern (e.g., a snaking slotting pattern). In an embodiment, the design may be partially or entirely symmetric, such that the electrode pattern is symmetric about one or more lines that cross a center point of the sense electrodes. In an exemplary embodiment of an entirely symmetric design, the slotting pattern may be identical about any line that crosses the center point of the sense electrodes.

Figure 9:
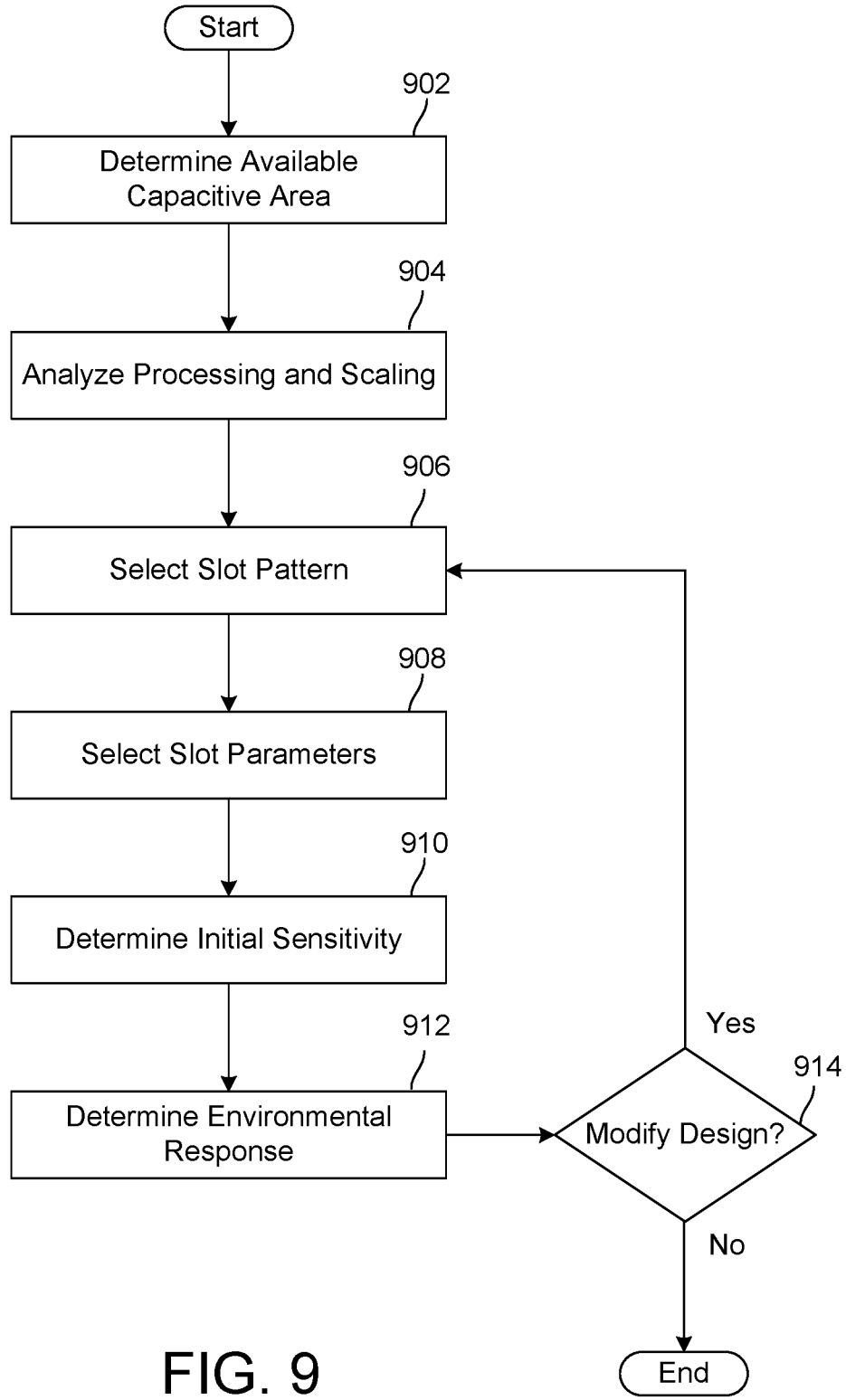
FIG. 9 depicts exemplary steps for a method of designing a slotted electrode pattern in accordance with some embodiments of the present disclosure.
Figure 10:
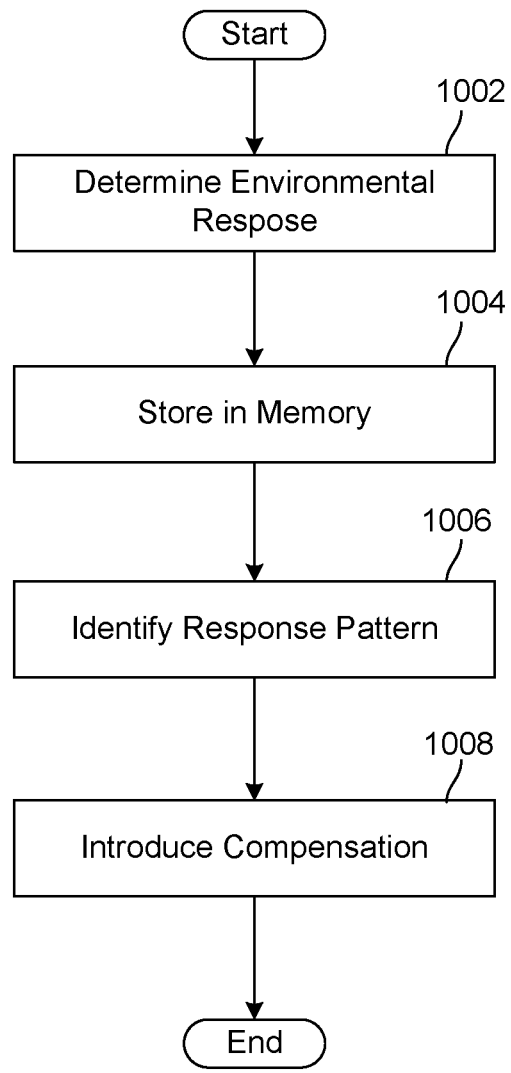
FIG. 10 depicts exemplary steps for a method of providing compensation to a MEMS sensor over a lifetime of exposure to an operating environment in accordance with some embodiments of the present disclosure.

FIGS. 9-10 depict exemplary steps for designing and implementing a slotted sense electrode structure in accordance with some embodiments of the present disclosure. Although FIGS. 9-10 are described in the context of the slotted sense electrodes present disclosure, it will be understood that the designs, components, configurations, methods, and steps described herein and in FIGS. 9-10 may be applied to any suitable components of a MEMS sensors, including other electrode types (e.g., drive electrodes) or non-electrode components of the MEMS sensors. Although a particular order and flow of steps is depicted in FIGS. 9-10, it will be understood that in some embodiments one or more of the steps may be modified, moved, removed, or added, and that the flow depicted in FIGS. 9-10 may be modified.

FIG. 9 depicts exemplary steps for a method of designing a slotted electrode pattern in accordance with some embodiments of the present disclosure. Processing may begin with an exemplary sensor design, such as for an inertial design. The design may include components such as a spring-mass system in a MEMS device plane having one or more proof masses that move relative to an underlying substrate (e.g., out-of-plane sensing) or within the MEMS device plane (e.g., in-plane sensing) in response to a particular inertial force to be measured by the sensor (e.g., linear acceleration, angular velocity, or magnetic field).

At step 902, the available capacitive area for the sense electrode may be determined. This available capacitive area may be based on a portion of the sense electrode that is located relative (e.g., parallel) to an adjacent section of the proof mass that responds to the measured sensor movement, as well as the manner in which the proof mass moves relative to the sense electrode (e.g., normal to a surface of the sense electrode, at an angle due to levered movement, etc.). In some embodiments (e.g., in response to levered motion in which proof mass becomes situated at an angle relative to the surface of the sense electrode) an effective capacitive area may be determined, e.g., based on certain portions of the sense electrode having more capacitive interaction with the poof mass. Once the available capacitive area is determined, processing may continue to step 904.

At step 904, the available sense electrode materials, analog circuitry, and/or digital circuitry may be analyzed to determine the types of processing, amplification, filtering, and scaling that may be performed on a capacitive signal that is output from a sense electrode and/or proof mass. For example, particular processing circuitry may accommodate a particular range of capacitances that can be processed with an acceptable accuracy for a particular application, which may impact a portion of the sense electrode that may be used for slotting while maintaining appropriate capacitive resolution. Different sense electrode materials may also provide for different sense electrode sensitivity. For example, in an embodiment a range of acceptable material removal may be determined, which in some embodiments may be in the single or low double digits, such as at least 4% to provide adequate slotting, less than 33% to provide adequate capacitive sensing, and in one embodiment, a range of 8%-20%.

At step 906, a slot pattern may be selected based on the information determined from steps 902 and 904, and in some embodiments, different information such as available slot designs. For example, selection of a slot pattern may be dependent on factors such as the shape of the available capacitive area from step 902, constituent materials and cracking patterns from step 904, processing resolution from step 904, and available slotting area from step 904. Once an appropriate slot pattern is selected, processing may continue to step 908.

At step 908, slot parameters may be selected. Slot parameters may include parameters such as slot density, slot width, and slot depth. In an embodiment, these parameters may be optimized to limit the formation of complete crystalline cracking pattern while providing a suitable capacitive sensing area for the particular application, sensor configuration and circuitry. Once the slot parameters are selected, processing may continue to step 908.

At step 910, an initial slotting design may be analyzed to determine an initial sensitivity. Such analysis may be performed in whole or in part based on simulations, or in some embodiments, prototype components may be fabricated for analysis. The sensor response may be analyzed over an expected range of sensed motion such as inertial motion, e.g., to verify that the sense electrode design accommodates a full range of measured signals with sufficient precision, and to store scaling and trimming factors for use during operation. Processing may then continue to step 912.

At step 912, an environmental response may be determined. Such analysis may be performed in whole or in part based on simulations, or in some embodiments, prototype components may be fabricated and lifetime testing may be performed to measure impacts of environmental conditions on the sensor. In embodiments, performance may be measured for known inertial forces at different stages in lifetime testing, in order to determine how the response of particular sense electrode designs changes over time in different environmental conditions. In some embodiments, this information may be used to adjust the operation of the sensor over time, or in response to particular measured environmental conditions for the sensor. In other embodiments, it may be determined that a particular sense electrode design does not provide acceptable performance in particular environmental conditions or over a required length of life cycle. After the environmental response is determined, processing may continue to step 914.

At step 914, it may be determined whether to modify the sense electrode design, for example, because the measured lifecycle testing did not provide acceptable results or in order to further improve a design. If the sense electrode design is to be modified, processing may continue to step 906. If the sense electrode design is not to be modified, values such as scaling values and compensation values may be saved for use during sensor operation. The processing of FIG. 9 may then end.

FIG. 10 depicts exemplary steps for a method of providing compensation to a MEMS sensor over a lifetime of exposure to an operating environment in accordance with some embodiments of the present disclosure. As described herein, a sense electrode design may improve the response of the sense to environmental conditions. In some embodiments, a design may also provide predictability as to how the sense characteristics will change over time (e.g., based on testing performed in FIG. 9, and as described herein).

At step 1002, an environmental response may be determined. In an embodiment, an environmental response may be determined during design and/or manufacturing (e.g., as described with respect to FIG. 9). In other embodiments, an environmental response may be determined in the field during operation. For example, in an embodiment one or more drive test electrodes may apply a known force to cause a proof mass or other mass (e.g., a test mass) to move in a known manner relative to a sense electrode or a sense test electrode (e.g., an electrode portion having the same pattern as the sense electrode, for example, located opposite test mass). Based on changes in the response to the known motion, an operational environmental response may be determined. Processing may then continue to step 1004.

At step 1004, the environmental response may be stored in memory, or in some embodiments, provided as modifications to register values or other circuitry. In some embodiments, data representing the environmental response may be stored along with information relating to the sensor circuitry, such as modifications to the operation of the sensor (e.g., drive forces, scaling factors, amplification, filtering, etc.) that may be used to compensate for changes in the environmental response. Processing may then continue to step 1004.

At step 1006, a response pattern for the sensor may be identified, such that an update to the operation of the sensor may be provided. A response pattern may be based on suitable operational data such as time in service, actual sensor run time, measured responses (e.g., based on test masses and/or electrodes), or other measurements of actual environmental conditions (e.g., temperature, rate of change of temperature, etc.), and a variety of combinations thereof. In some embodiments, the response pattern data may be used to directly determine a condition of a sense electrode, or in other embodiments, a likely condition may be determined based on a look-up of relevant information or calculations based on expected responses to measured response pattern data. Processing may then continue to step 1008.

At step 1008, the operation of the sensor may be modified to compensate for the environmental conditions. In an embodiment, calculations of a sensed value (e.g., for linear acceleration, angular velocity, or magnetic field) may be modified by changing the manner in which the value is calculated from a sensed capacitance, e.g., by modifying amplifier gains, filter parameters, scaling factors, or other analog or digital operating parameters. In this manner, the operation of the sensor may be compensated to allow for accurate calculations in spite of environmental conditions, based at least in part in the improved response to due to the improved environmental response as a result of the slotted sense electrode design. Once compensation has been performed, the processing of FIG. 10 may end.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A system for providing for capacitive sensing of an external force on a microelectromechanical system (MEMS) device, the system comprising:
   a substrate located in a first plane;
   a movable component of a MEMS device layer, the MEMS device layer coupled to the substrate, wherein the movable component moves along a first axis in response to the external force; and
   a sense electrode disposed on the substrate in the first plane, wherein a first capacitive sensing element is formed between the movable component and the first sense electrode, wherein the first capacitive sensing element is configured to be responsive to the motion of the movable component along the first axis,
   wherein the sense electrode comprises a plurality of slots that substantially extend between two non-adjacent sides of the sense electrode, and wherein the plurality of slots comprise at least 8% of the surface area of the sense electrode and less than 20% of the surface area of the sense electrode.

2. The system of claim 1, wherein the plurality of slots substantially extend between two parallel sides of the sense electrode.

3. The system of claim 2, wherein the two parallel sides comprise two long sides of the sense electrode.

4. The system of claim 2, wherein the two parallel sides comprise two short sides of the sense electrode.

5. The system of claim 1, wherein the plurality of slots comprises a comb pattern.

6. The system of claim 1, wherein the plurality of slots comprise a partial hexagonal pattern.

7. The system of claim 1, wherein at least a portion of each of the plurality of slots is located parallel to another of the plurality of slots.

8. The system of claim 1, wherein the first axis is perpendicular to the first plane.

9. The system of claim 1, further comprising:
- a second movable component of the MEMS device layer, wherein the second movable component moves along a second axis in response to the external force; and
- a second sense electrode disposed on the substrate in the first plane, wherein a second capacitive sensing element is formed between the second movable component and the second sense electrode, wherein the second capacitive sensing element is configured to be responsive to the motion of the second movable component along the second axis, and wherein the second sense electrode comprises a second plurality of slots that substantially extend between two non-adjacent sides of the second sense electrode.

10. The system of claim 9, further comprising a center point located in the first plane between the sense electrode and the second sense electrode, wherein the plurality of slots and the second plurality of slots are symmetrical about a line that passes through the center point in the first plane.

11. The system of claim 9, further comprising a processing unit coupled to the first sense electrode and the second sense electrode to determine a value of an external force based on a combined measurement of the first capacitive sensing element and the second capacitive sensing element.

12. The system of claim 1, wherein the plurality of slots comprises multiple angled slots.

13. The system of claim 12, wherein three of the angled slots intersect at 120 degree angles.

14. The system of claim 1, wherein the sense electrode comprises a folded strip electrode.

15. The system of claim 14, wherein the length of the folded strip electrode is longer than the length of the perimeter of the sense electrode.

16. The system of claim 14, wherein the folded strip electrode substantially forms a square wave pattern, a spiral pattern, a T-slot pattern, a Y-slot pattern, or a recessed slot pattern.

17. The system of claim 1, further comprising:
- a second sense electrode disposed on the substrate in the first plane, wherein a second capacitive sensing element is formed between one or more components of the MEMS device layer and the second sense electrode; and
- processing circuitry coupled to the sense electrode and the second sense electrode to receive a first signal from the sense electrode and a second signal from the second sense electrode, the processing circuitry configured to combine the first signal and the second signal to output a signal responsive to movement of at least a portion of the MEMS device layer along the first axis.

* * * * *